(12) United States Patent
Telefus et al.

(10) Patent No.: US 10,819,336 B2
(45) Date of Patent: *Oct. 27, 2020

(54) ELECTRONIC SWITCH AND DIMMER

(71) Applicant: INTELESOL, LLC, Danville, CA (US)

(72) Inventors: Mark Telefus, Orinda, CA (US); Harry Rodriguez, Gilroy, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/759,996

(22) PCT Filed: Jul. 11, 2018

(86) PCT No.: PCT/US2018/059564
§ 371 (c)(1),
(2) Date: Apr. 28, 2020

(87) PCT Pub. No.: WO2019/133110
PCT Pub. Date: Jul. 4, 2019

(65) Prior Publication Data
US 2020/0287537 A1    Sep. 10, 2020

Related U.S. Application Data

(60) Provisional application No. 62/611,460, filed on Dec. 28, 2017.

(51) Int. Cl.
| | | |
|---|---|---|
| *H03K 17/687* | (2006.01) | |
| *H02M 1/08* | (2006.01) | |
| *H05B 45/325* | (2020.01) | |
| *H05B 45/37* | (2020.01) | |

(Continued)

(52) U.S. Cl.
CPC .......... *H03K 17/6874* (2013.01); *H02M 1/08* (2013.01); *H02P 27/04* (2013.01); *H05B 45/10* (2020.01); *H05B 45/325* (2020.01); *H05B 45/37* (2020.01)

(58) Field of Classification Search
CPC .. H03K 17/6874; H05B 45/37; H05B 45/325; H05B 45/10; H02M 1/08; H02P 27/04
See application file for complete search history.

(56) References Cited

U.S. PATENT DOCUMENTS

| | | | |
|---|---|---|---|
| 4,074,345 | A | 2/1978 | Ackermann |
| 4,127,895 | A | 11/1978 | Krueger |
| 4,487,458 | A | 12/1984 | Ianutka |

(Continued)

FOREIGN PATENT DOCUMENTS

| | | |
|---|---|---|
| WO | WO2010/110951 | 9/2010 |
| WO | WO2017/196572 | 11/2017 |

*Primary Examiner* — Robert L Deberadinis
(74) *Attorney, Agent, or Firm* — Mark Wisnosky

(57) ABSTRACT

A bidirectional switch for the control of power from an AC source to a load is described. The approach uses power MOSFETs in a bidirectional switch subcircuit configuration having an optically coupled, electrically floating control circuit that self-biases the switches into the "on" state and uses an optically coupled control element to force the switches into the "off state. The time constant of the control circuit is fast enough to allow phase control as well as on-off control. A boost circuit is included to ensure that the control voltage exceeds a threshold voltage of the MOSFETs to force an off state. A plurality of subcircuits can be easily cascaded to provide improved performance.

25 Claims, 20 Drawing Sheets

(51) Int. Cl.
*H02P 27/04* (2016.01)
*H05B 45/10* (2020.01)

(56) References Cited

U.S. PATENT DOCUMENTS

| | | |
|---|---|---|
| 4,760,293 A | 7/1988 | Hebenstreit |
| 5,559,656 A | 9/1996 | Chokhawala |
| 5,654,880 A | 8/1997 | Brkovic et al. |
| 5,731,732 A | 3/1998 | Williams |
| 6,111,494 A | 8/2000 | Fischer |
| 6,169,391 B1 | 1/2001 | Lei |
| 6,538,906 B1 | 3/2003 | Ke et al. |
| 7,643,256 B2 | 1/2010 | Wright et al. |
| 7,729,147 B1 | 6/2010 | Wong et al. |
| 7,746,677 B2 | 6/2010 | Unkrich |
| 8,482,885 B2 | 7/2013 | Billingsley et al. |
| 9,055,641 B2 | 6/2015 | Shteynberg et al. |
| 9,287,792 B2 | 3/2016 | Telefus et al. |
| 9,621,053 B1 | 4/2017 | Telefus |
| 10,469,077 B2 | 11/2019 | Telefus et al. |
| 10,615,713 B2 | 4/2020 | Telefus et al. |
| 2005/0162139 A1 | 7/2005 | Hirst |
| 2007/0008747 A1 | 1/2007 | Soldano et al. |
| 2010/0155369 A1 | 6/2010 | Kularatna et al. |
| 2010/0244730 A1 | 9/2010 | Nerone |
| 2010/0320840 A1 | 12/2010 | Fridberg |
| 2011/0292703 A1 | 12/2011 | Cuk |
| 2013/0051102 A1 | 2/2013 | Huang et al. |
| 2014/0085940 A1 | 3/2014 | Lee et al. |
| 2015/0097430 A1 | 4/2015 | Scruggs |
| 2020/0052607 A1* | 2/2020 | Telefus ................... H02J 3/00 |

* cited by examiner

ELECTRONIC SWITCH AND DIMMER

CROSS-REFERENCE TO RELATED APPLICATIONS

This application claims priority to U.S. Provisional application 62/611,460, filed Dec. 28, 2017, Titled: Electronic Switch and Dimmer, by the same inventors.

STATEMENT REGARDING FEDERALLY SPONSORED RESEARCH OR DEVELOPMENT

Not Applicable.

BACKGROUND OF THE INVENTION

Technical Field

The invention relates to a power management system and methods to provide an electronic switch and dimming control.

Related Background Art

Traditional access to alternating current (AC) electrical power in home and business environments is provided by mechanical outlets that are wired into the facility electrical system. These outlets are protected from excessive electrical loads or potentially dangerous ground faults using electromechanical devices such as fuses and circuit breakers. Similarly, the control of conventional electrical room appliances such as lighting and ceiling fans occurs using electromechanical switches. These fundamentally mechanical control devices provide simple on-off control and inevitably wear out and, over time, can cause short circuits or potentially dangerous arcing.

More nuanced control of common electrical appliances is typically provided by electronic devices such as triacs which allow the AC mains waveform to be interrupted on a cycle-by-cycle basis, so-called phase control. Although significantly more efficient than the rheostats or autotransformers that preceded them, triacs are still too inefficient to be used effectively in small enclosures for the control of large electrical loads and can induce electrical noise back into the facility electrical system.

Thus, there is a need for an improved electronic control system that provides a wider range of more reliable and highly efficient control options for broad application in facility electrical systems. Furthermore, there is a need for such a control system that can be realized using semiconductor devices that can be integrated with other circuitry for advanced power control functions that can be manufactured at low cost.

BRIEF SUMMARY OF THE INVENTION

The present invention relates to a novel approach for the control of AC power throughout a facility electrical system ranging from simple outlet on-off switching to continuous variation of the applied AC power for, for example, the dimming of electrical lights. More particularly the invention relates to a combination of functions that provides in one embodiment both on-off and phase-control of the AC mains waveform.

One embodiment uses power MOS field-effect transistors (MOSFETs) as electronic switches having very low "on" resistance connected between the AC mains supply and the desired load. Since typical power MOSFETs intrinsically incorporate a body diode in parallel with the conducting channel, pairs of devices are connected in a back-to-back arrangement having the source terminals in common to provide a truly bidirectional (AC) switch configuration. In order to control the switching action of the power MOSFETs a novel floating control circuit is employed that uses rectifying diodes connected at the drains to precharge the gate-source bias voltage thereby turning both devices "on", and an optically coupled phototransistor that shorts the gate terminals to the common source terminal to force the devices into their "off" state when illuminated by an isolated optical source. Thus, the power MOSFET switches are normally "on" unless forced "off" by the optical control signal. The optical control signal can be applied continuously for nominal on-off control of the power delivered to the load, or it can be synchronized with the AC mains waveform to provide phase control. Integrated control circuitry for the optical control signal can provide either leading edge phase control preferred for switching reactive loads or trailing edge phase control preferred for nonlinear loads such as LEDs. The specific examples are not intended to limit the inventive concept to the example application. Other aspects and advantages of the invention will be apparent from the accompanying drawings and detailed description.

DETAILED DESCRIPTION OF THE INVENTION

Figure 1:
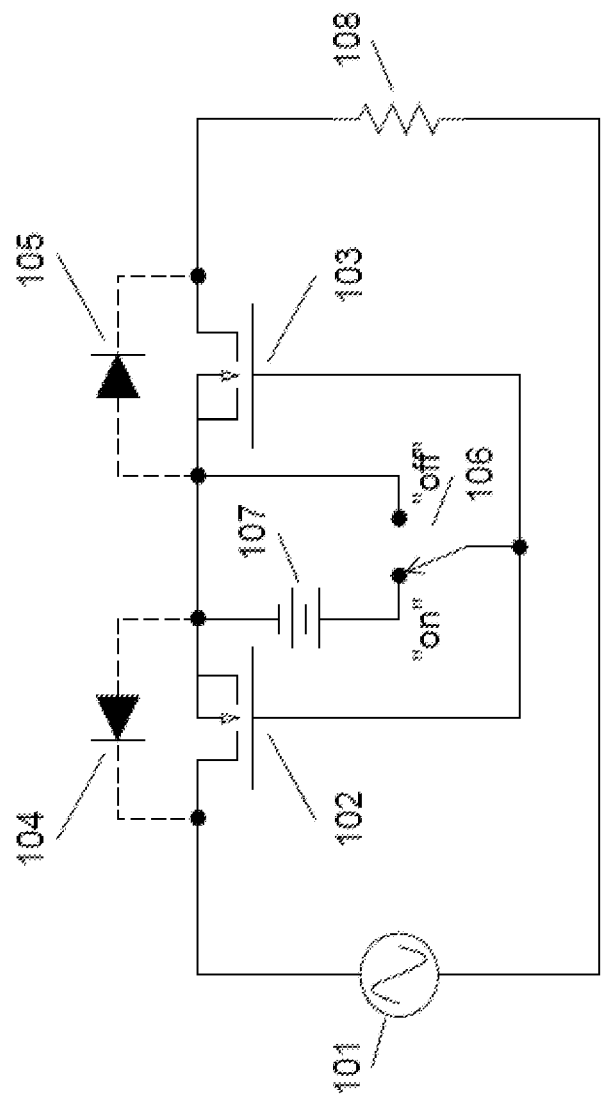
FIG. 1 is a schematic diagram of the basic power MOSFET bidirectional switch unit.

FIG. 1 is a schematic diagram showing the basic power MOSFET bidirectional switch controlling the power delivered from AC source 101 to load 108. Power MOSFETs 102 and 103 include body diodes 104 and 105, respectively. Switch 106 controls the gate-to-source bias voltage applied to power MOSFETs 102 and 103. In the "on" position bias voltage 107 is applied to the gate terminals of the power MOSFETs. Voltage 107 is a voltage greater than the threshold voltage of the power MOSFETs (typically 5 to 10 volts) causing an inversion layer to form thereby creating a conducting channel extending from the drain to the source of each device. In this "on" state, the drain-to-source behavior of each power MOSFET can be modeled as a low value resistor, $R_{ds}$. As long as the voltage drop between drain and source remains below about 0.6 volt, the body diodes remain nonconductive and can be neglected. In the "on" state the circuit of FIG. 1 is equivalently the load 108 connected to AC source 101 through a series resistor having value $2R_{ds}$.

In the "off" position of switch 106 the gate terminals of the power MOSFETs are shorted to the source terminals and the drain-to-source conducting channels vanish as long as the drain-to-source voltage remains below the breakdown voltage of the body diodes. In the "off" state the circuit of FIG. 1 is equivalently the load 108 connected to AC source 101 through back-to-back body diodes 104 and 105, which effectively disconnects the load 108 from source 101.

The requirement that the drain-to-source voltage of the power MOSFETs remain below the breakdown voltage of the body diodes, $V_{br}$, in the "off" state requires that the breakdown voltage of the body diodes exceed the peak voltage of AC source 101. Thus, for example, assuming that source 101 corresponds to a common 120 volt (rms) AC mains, then the breakdown voltage of each body diode must exceed the peak source voltage of 170 volts.

A more detailed analysis of the power MOSFET structure shows that the body diode is effectively the base-collector junction of a bipolar transistor connected in parallel with the MOSFET channel. Additional parasitic elements include the capacitance of the base-collector junction and a parasitic resistance between the base and the emitter. This AC-coupled circuit places a constraint on the rate of change of the drain-to-source voltage, $dV_{ds}/dt$, to avoid forward biasing the base-emitter junction, thereby causing the bipolar transistor to conduct while the MOSFET channel is "off". While the resulting leakage current may not be sufficient to energize the load 108, it may be large enough to cause additional efficiency or safety concerns.

Similarly, consideration of the constraints in the "on" state require that the drain-to-source voltage drop for each power MOSFET given by $R_{ds}*Iload$ be less than about 0.6 volts. Potentially more important is the power dissipated in each power MOSFET in the "on" state given by $R_{ds}*Iload^2$ which must remain less than a few watts to avoid excessive temperature rise. Thus, for example, switching a common household circuit from a 120 volt AC mains having a typical limit of 20 amperes requires that $R_{ds}$ for each power MOSFET be less than 0.005 ohms (5 milliohms.)

It is well known in the art that the breakdown voltage of the body diode can be advantageously traded off against the value of $R_{ds}$ by varying the structure and the doping levels in the device. In particular, it has been shown that the value of $R_{ds}$ is proportional to $V_{br}^{2.5}$. Thus, for example, cutting $V_{br}$ in half results in reducing $R_{ds}$ by a factor of 5.7. The circuit of FIG. 1 shows that the conceptual bias switching circuit comprising switch 106 and voltage source 107 floats electrically with the common source terminals of the back-to-back power MOSFETs 102 and 103 which vary across the entire peak-to-peak range of source 101. Although simple in concept, this circuit can be difficult to realize in practice at low cost.

Figure 2:
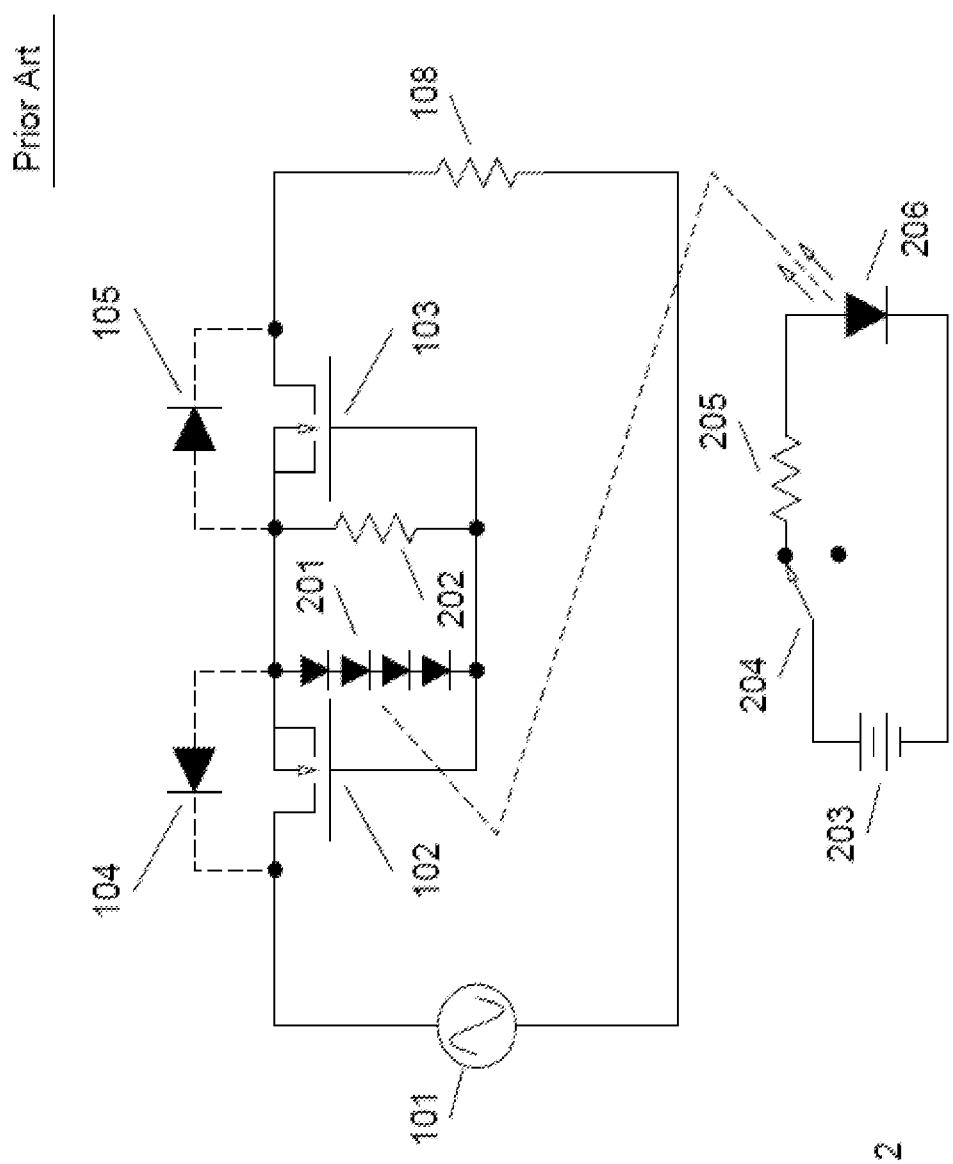
FIG. 2 is a schematic diagram of a prior art bidirectional switch using optoelectronic bias generation.

FIG. 2 shows a schematic diagram of a prior art approach to the control circuit. Voltage source 106 in FIG. 1 is replaced with a photovoltaic diode stack 201 that provides the needed gate-to-source bias voltage when illuminated by a light emitting diode (LED) 206 which is powered by a separate low voltage source 203 and controlled by switch 204 through current limiting resistor 205. Elements 203-206 are assumed to be within optical proximity of diode stack 201. When LED 206 is switched off, the voltage across diode stack 201 is drained through resistor 202 and the power MOSFETs enter the "off" state.

Although the circuit of FIG. 2 works for simple on-off switching applications, the time constants associated with charging and discharging the gate-to-source capacitance of the power MOSFETs through the bias circuitry are typically too large to effect phase control in 50/60 Hz AC mains.

Figure 3:
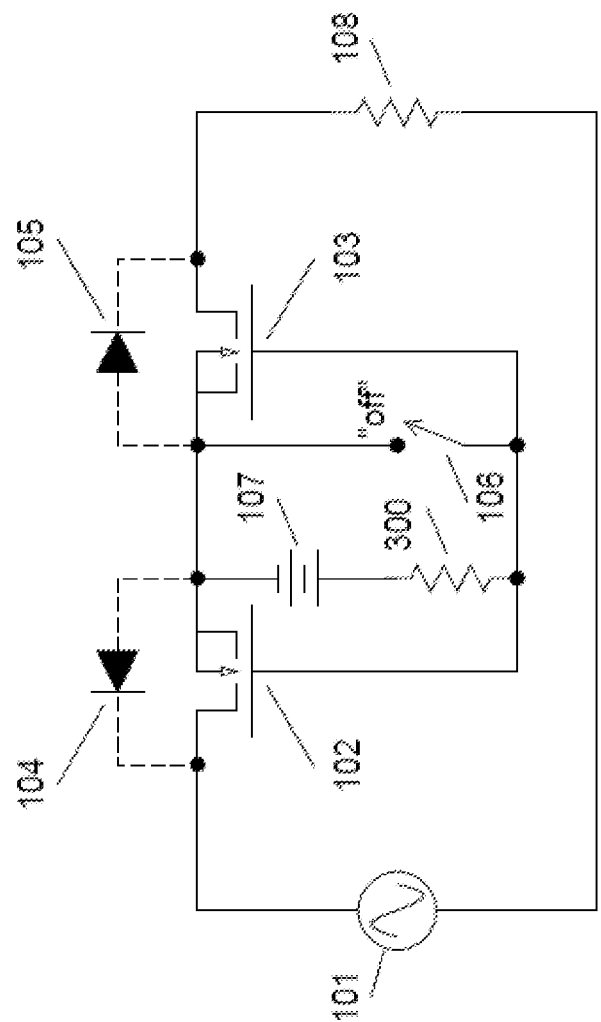
FIG. 3 is a schematic diagram of the basic elements of the improved bidirectional switch.

FIG. 3 is a schematic diagram showing the basic elements of an improved switch circuit. Although power MOSFETs are the preferred embodiment switching devices discussed in the following description, it will be apparent to one skilled in the art that other types of field-effect transistors can be advantageously employed in the improved circuit. As in FIG. 1, voltage 107 is used to bias power MOSFETs 102 and 103 into their "on" state. Opposite to the operation of the circuit in FIG. 1, the power MOSFETs are "on" only as long as switch 106 remains open. When switch 106 is closed the power MOSFETs are forced to enter their "off" state since their gates and sources are shorted together and voltage 107 is dropped across resistor 300.

Figure 4:
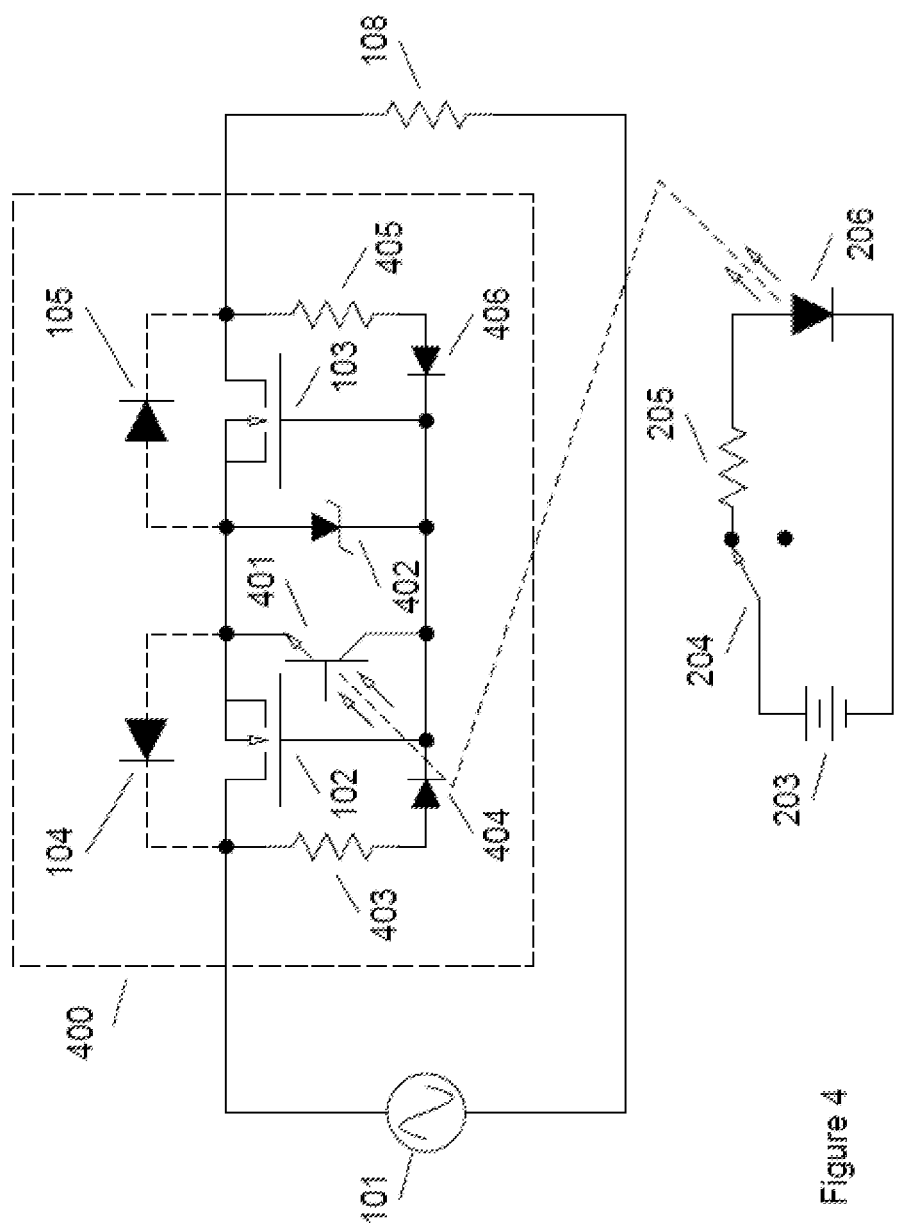
FIG. 4 is a schematic diagram of an embodiment of the improved bidirectional switch.
Figure 5:
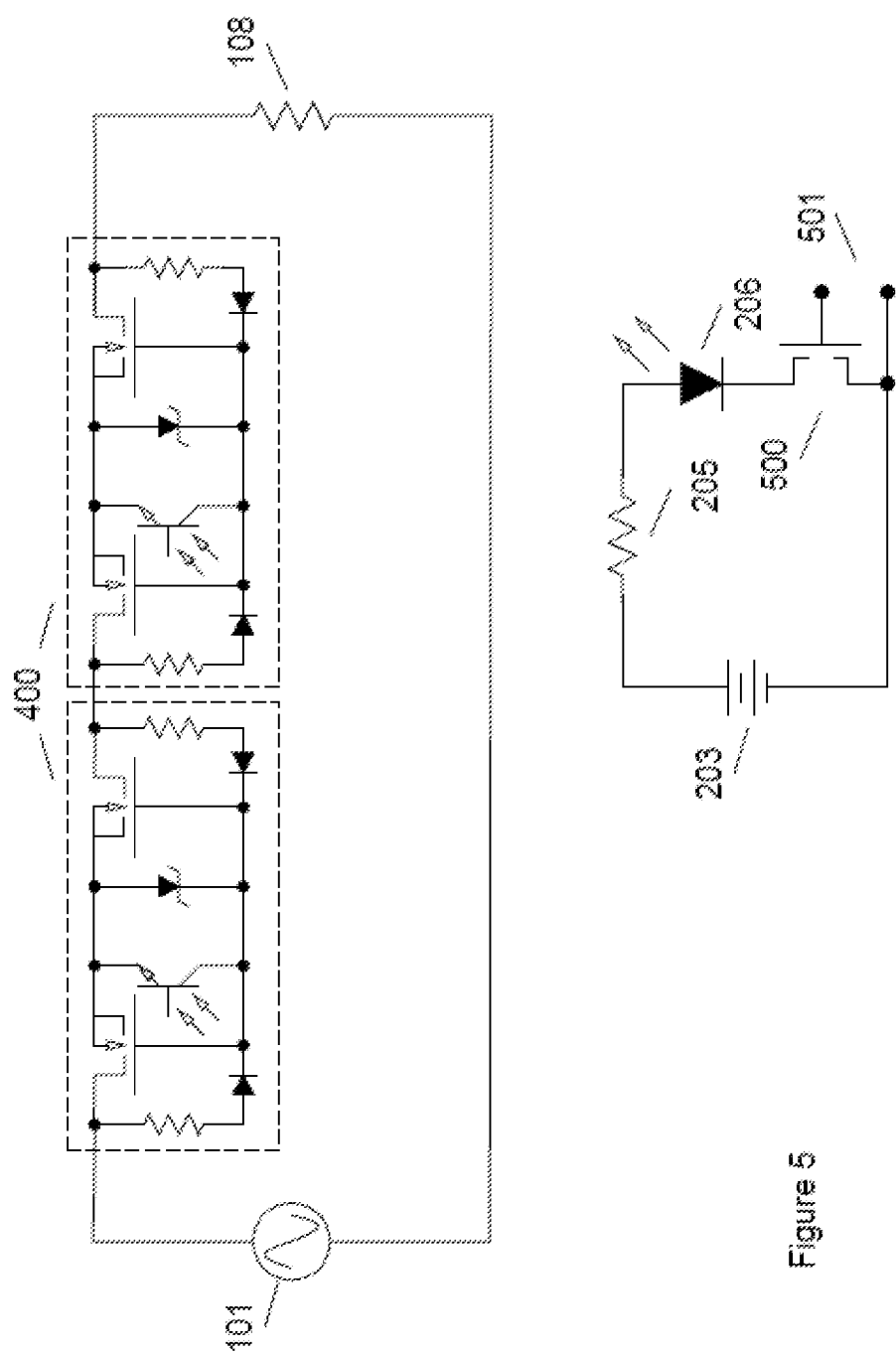
FIG. 5 is a schematic diagram of the embodiment of FIG. 3 using two switching elements to reduce total switch "on" resistance and increase total switch "off" resistance.

FIG. 4 is a schematic diagram showing an embodiment of the inventive circuit. Voltage source 107 in FIG. 1 is replaced in switching unit 400 with a Zener diode 402 having a Zener voltage greater than the threshold voltage of the power MOSFETs. Zener diode 402 is biased through rectifier diodes 404 and 406 connected at the drain terminals of the power MOSFETs and protected by current limiting resistors 403 and 405, respectively. Thus, in the absence of illumination resistor-diode branches 403-404 and 405-406 provide bias for Zener diode 402 when either of the drain terminals exceeds the Zener voltage, placing power MOSFETs 102 and 103 in the "on" state. When illuminated by LED 206 phototransistor 401 shunts the bias current from branches 403-404 and 405-406 to the source terminals of the power MOSFETS placing them in the "off" state. In this circuit the turn-on time constant is dictated by the value of the current limiting resistors 403 and 405 and the gate-to-source capacitance of the power MOSFETs, while the turn-off time constant is dictated by the saturation current of the phototransistor 401 at the illumination level provided by LED 206. Both of these time constants can be designed to be much shorter than the period of the AC mains, thereby allowing this embodiment to operate in both an on-off and a phase-control mode. FIG. 5 is a schematic diagram of the embodiment of FIG. 4 using two switch units 400 to improve the performance of the circuit. In this embodiment it is assumed that the power MOSFETs are selected to have half the breakdown voltage of the units used in FIG. 4. Thus, the on resistance of the individual switch units can be expected to be reduced by a factor of 5.7, as described above, and the total on resistance of the two switch units connected in series is reduced by a factor of 2.8 relative to the circuit in FIG. 4. Additionally, the voltage drop across each of the switch units in the "off" state is halved, thereby reducing the $dV_{ds}/dt$ experienced by each unit by a factor of two and consequently reducing the "off" state leakage current.

FIG. 5 also includes an electronic switch circuit to control the illumination of LED 206. The current through LED 206 from voltage source 203 is limited by resistor 205 and is controlled by transistor 500. Transistor 500 is controlled by an external control voltage applied to control terminals 501. This allows for the rapid switching of the LED in synchronism with the AC mains waveform through external control circuitry (not shown) to provide phase control of the applied AC waveform, as is used in dimmer applications. In another embodiment the control signal is a train of pulses synchronized with the AC mains waveform and having adjustable pulse widths to effectively control the average current/power delivered to the load, thereby providing a dimming effect for a light source load and a speed control for an AC motor load. In another embodiment the control signal is a train of pulses having a fixed or variable frequency independent of the AC mains waveform thereby generating a radio-frequency (RF) power waveform at the load terminals for use as a wireless charger/generator. In another embodiment the control signal is a variable DC voltage allowing variable illumination of the LED thereby allowing the MOSFETs to operate in a linear mode.

Figure 6:
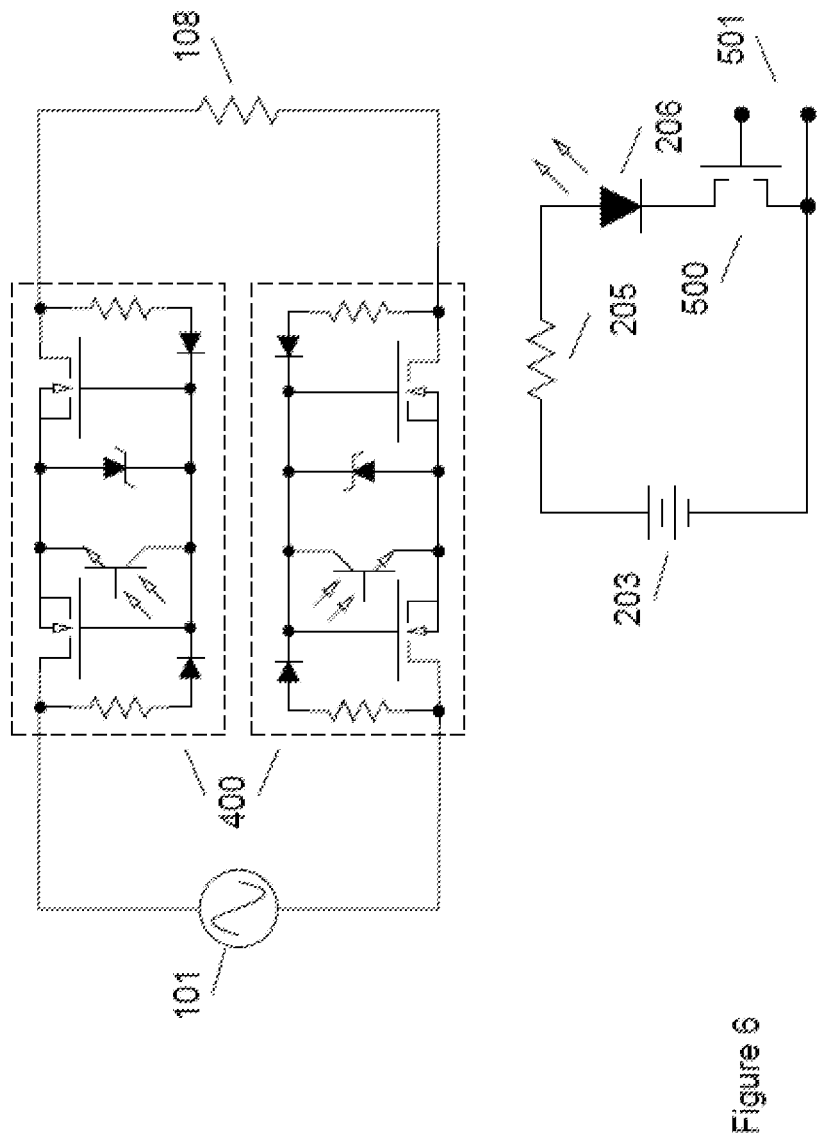
FIG. 6 is a schematic diagram of an embodiment similar to that of FIG. 3, but with the switching elements in both arms of the AC power supply.

FIG. 6 is a schematic diagram of an embodiment similar to that of FIG. 5, but with an individual switch unit 400 placed in each arm of the AC power supply. The inventor has found that this circuit configuration further improves the turn-off characteristics of the switch devices, further reducing leakage currents.

Figure 7:
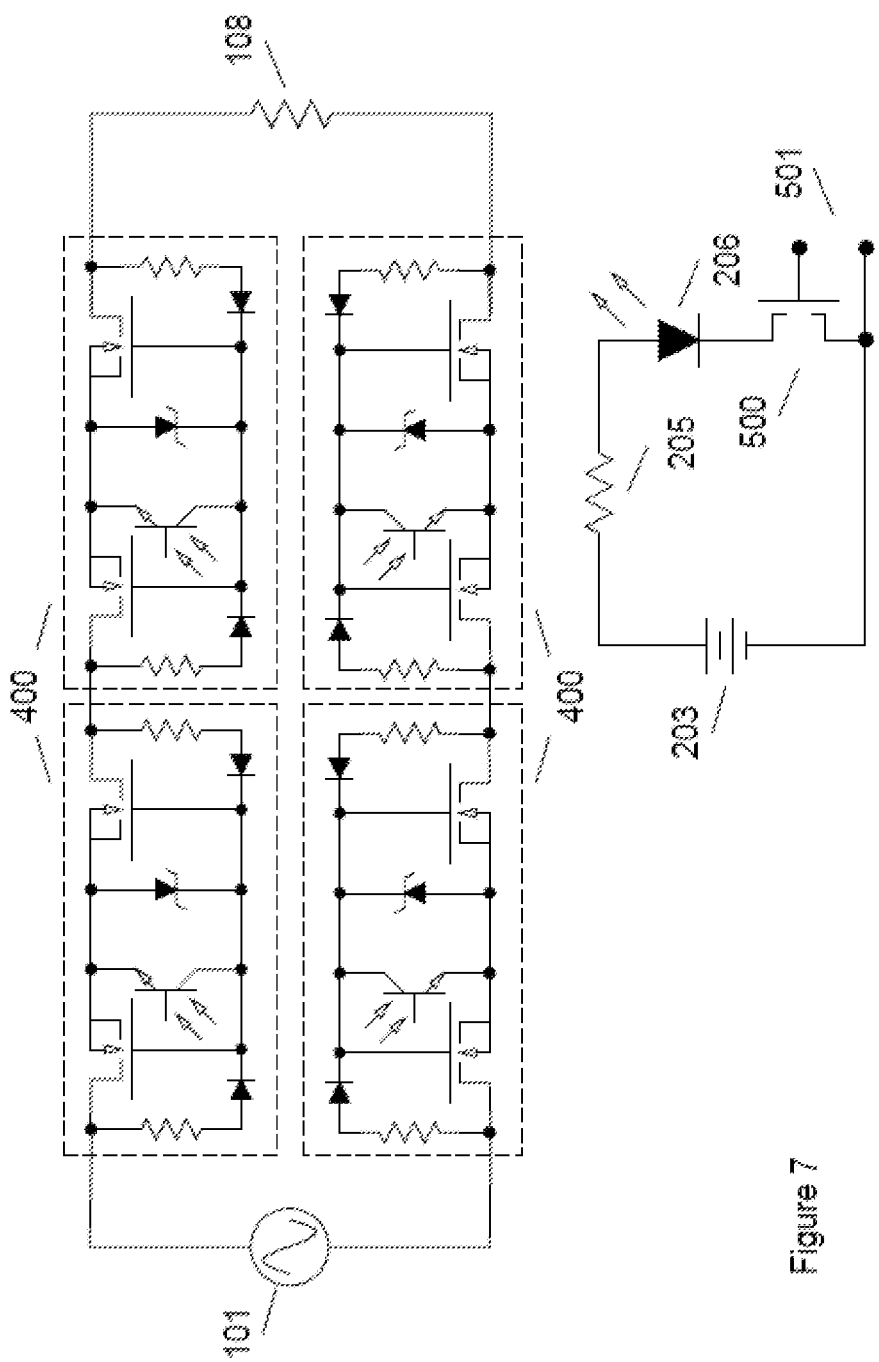
FIG. 7 is a schematic diagram of the embodiment of FIG. 5 using four switching elements to further reduce total switch "on" resistance and further increase total switch "off" resistance.

FIG. 7 is a schematic diagram of the embodiment of FIG. 6 using two switch units 400 in each arm of the AC supply to further improve the performance of the circuit. In this embodiment it is assumed that the power MOSFETs are selected to have one-fourth the breakdown voltage of the units used in FIG. 3. Thus, the on resistance of the individual switch units can be expected to be reduced by a factor of 32, as described above, and the total on resistance of the two switch units connected in series is reduced by a factor of 8 relative to the circuit in FIG. 4. Additionally, the voltage drop across each of the switch units in the "off" state is quartered, thereby reducing the $dV_{ds}/dt$ experienced by each unit by a factor of four and consequently further reducing the "off" state leakage current relative to the circuit in FIG. 4. As mentioned above, the inventor has found that this circuit configuration further improves the turn-off characteristics of the switch devices, further reducing leakage currents.

A known issue with prior art MOSFET switches is parasitics of the MOSFETS. In some cases, the parasitics result in the inability to complete shutoff power to the load. FIGS. 8 through 13 show improvements in the electronic switches as already described to overcome the effect of the parasitics by compensation or elimination. The improvements include changes to the architecture of the system and changes to the internal components of the switches themselves.

Figure 8:
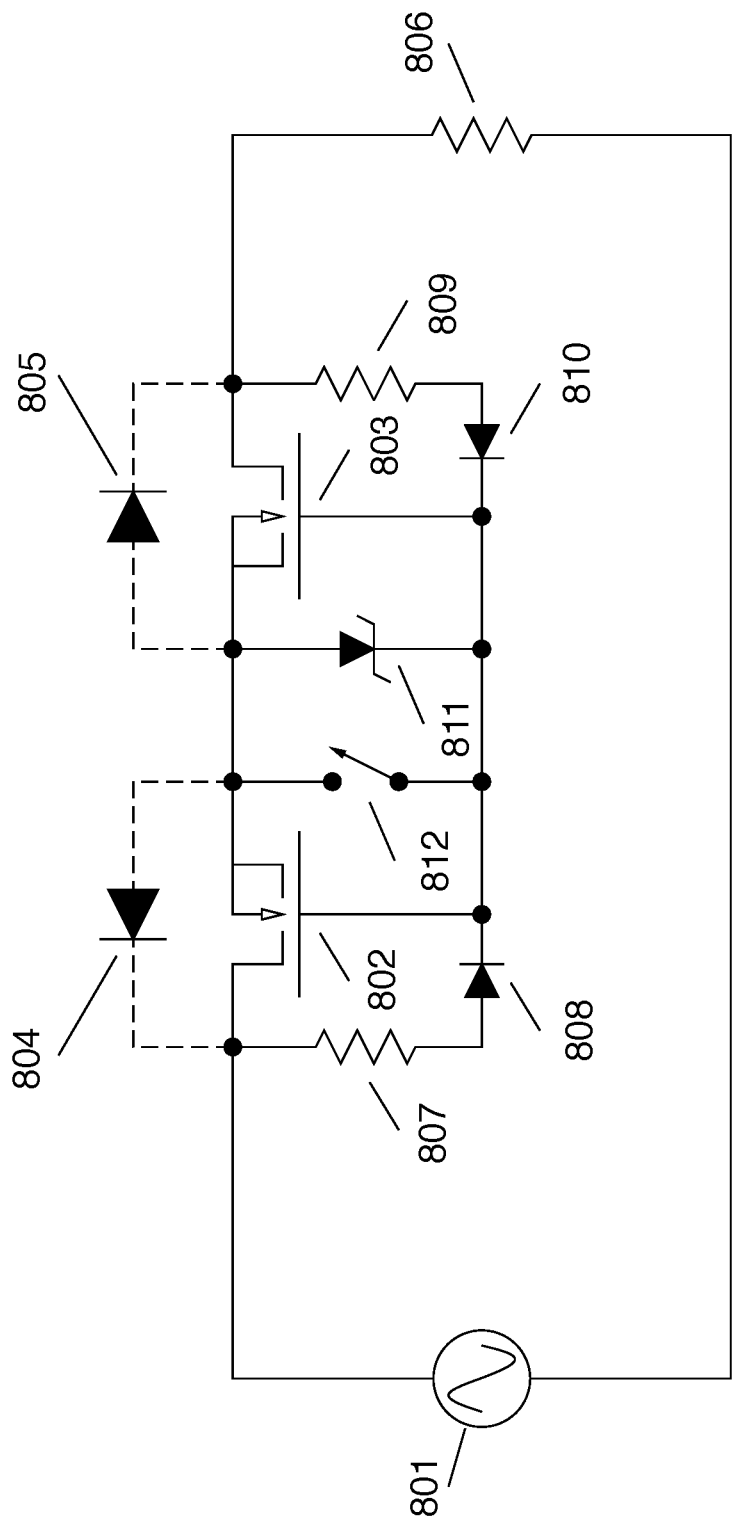
FIG. 8 is a schematic diagram showing the basic power MOSFET bidirectional switch.

FIG. 8 is a schematic diagram showing the basic power MOSFET bidirectional switch controlling the power delivered from AC source 801 to load 806. Power MOSFETs 802 and 803 include body diodes 804 and 805, respectively. Zener diode 811 exhibits a Zener voltage greater than the threshold voltage, VT, of the power MOSFETs 802 and 803. Zener diode 811 is biased through rectifier diodes 808 and 810 connected at the drain terminals of the power MOSFETs and protected by current limiting resistors 807 and 809, respectively. Thus, when switch 812 is open, resistor-diode branches 807-808 and 809-810 are intended to provide bias for Zener diode 811 when either of the drain terminals exceeds the Zener voltage, thereby placing power MOSFETs 802 and 803 in the "on" state. When closed, switch 812 shunts the bias current from branches 807-808 and 809-810 to the source terminals of the power MOSFETS placing them in the "off" state. In this circuit the turn-on time constant is dictated by the value of the current limiting resistors 807 and 809 and the gate-to-source capacitance of the power MOSFETs, while the turn-off time constant is dictated by the MOSFET capacitances and the on-resistance of switch 812. Both of these time constants can be designed to be much shorter than the period of the AC mains, thereby allowing this embodiment to operate in both an on-off and a phase-control mode.

Figure 9A:
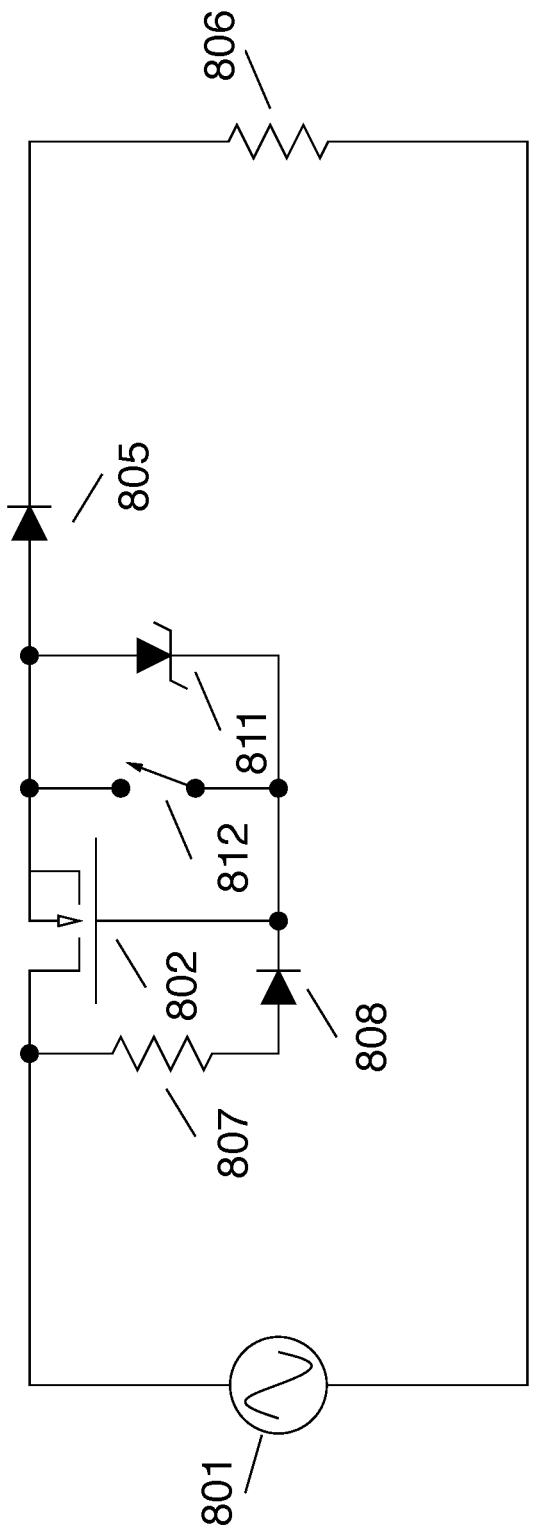
FIG. 9A is a schematic diagram showing the circuit elements in FIG. 8 that are active during the positive half-cycle of the ac mains waveform.
Figure 9B:
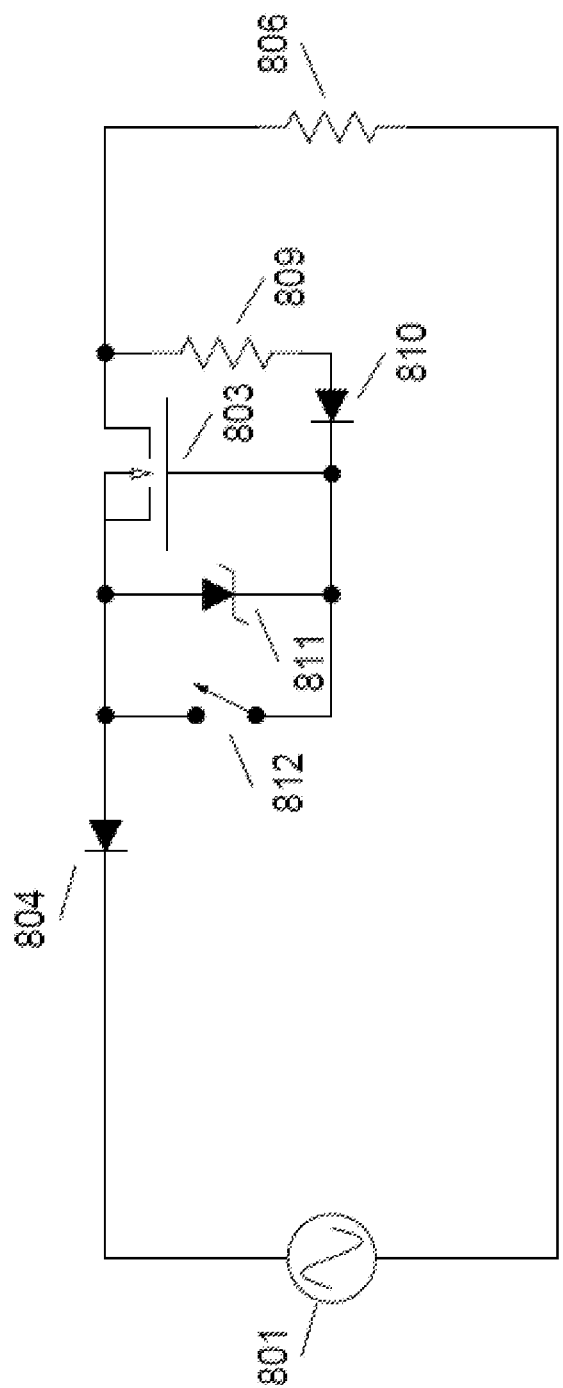
FIG. 9B is a schematic diagram showing the circuit elements in FIG. 8 that are active during the negative half-cycle of the ac mains waveform.

In practice, however, the Zener diode 811 never reaches its Zener voltage, and the gate-to-source voltage of MOSFETs 802 and 803 rarely exceeds the threshold voltage, VT. Thus, neither MOSFET 802 or 803 is fully "on" resulting in excess power dissipation in the units and reduced current supplied to the load 806. FIG. 9A shows the active components of FIG. 8 when the voltage source 801 is in the positive half-cycle of the ac mains waveform. When switch 812 opens to allow MOSFET 802 to enter its "on" state, the gate voltage of MOSFET 802 begins to follow the positive excursion of source 801 while the source voltage is at zero volts. When the gate voltage reaches the threshold voltage of MOSFET 802, current begins to flow to load 806 and body diode 805 from MOSFET 803 is forward biased. The source voltage of MOSFET 802 then "follows" the rise in the gate voltage, lagging it by the value of the threshold voltage plus an additional bias to account for the current supplied to the load. This condition is maintained until the waveform of source 801 becomes negative. Consequently, the drain-to-source voltage of MOSFET 802 never falls below its threshold voltage except around the zero-crossing of the ac mains waveform, regardless of the drain-to-source resistance of the MOSFET 802, and the power dissipated in the switch is ID*VT. If the gate voltage can be boosted well beyond the threshold voltage, the the dissipated power is given by ID2*rds, where rds is the "on" resistance of the switch. This value can be much smaller than ID*VT. FIG. 9B shows the active components of FIG. 8 when the voltage source 801 is in the negative half-cycle of the ac mains waveform. The gate voltage of MOSFET 803 starts at 0V and begins to follow the source voltage negative once the source voltage drops to −VT where current begins to flow through load 806 and body diode 804 of MOSFET 802 is forward biased. The drain voltage of MOSFET 803 is effectively clamped to the gate voltage, so the drain-to-source voltage remains at VT until the waveform of source 801 becomes positive. Consequently, the drain-to-source voltage of MOSFET 803 never falls below its threshold voltage except around the zero-crossing of the ac mains waveform, regardless of the drain-to-source resistance of the device, and the power dissipated in the switch is also ID*VT in the negative half-cycle.

Figure 9C:
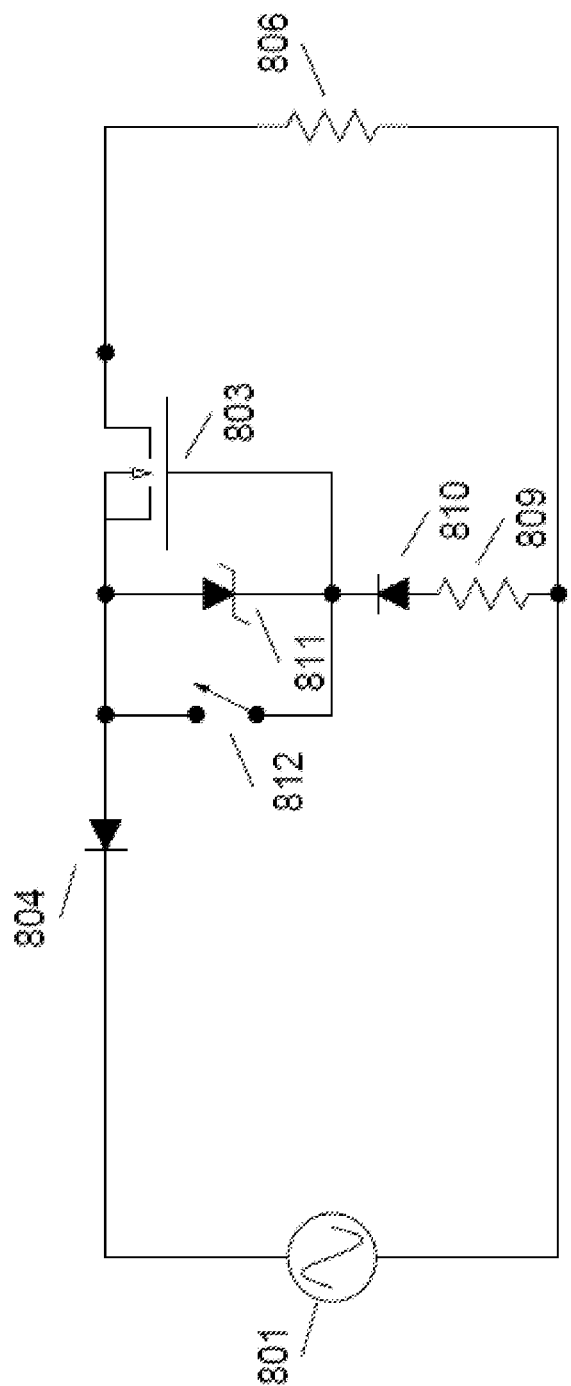
FIG. 9C shows a schematic diagram of the half-circuit of FIG. 9B that allows a boost of the gate voltage.

FIG. 9C shows a schematic of the half switch shown in FIG. 9B that allows a boost of the gate voltage. It differs from the circuit of FIG. 9B in that the branch including diode 810 and bias resistor 809 is moved from the drain of MOSFET 803 to the ac mains neutral line. This configuration avoids the clamping action that occurs for the configuration of FIG. 9B and allows Zener diode 811 to reach its Zener voltage, VZ, when the source of MOSFET 803 falls to −VZ. This causes the gate-to-source voltage of MOSFET 803 to be VZ which can be significantly larger than VT, thereby exhibiting a small value of rds and decreasing power dissipation. Furthermore, this boosted gate-to-source biased is stored on the gate-to-source capacitances of MOSFETs 802 and 803, and is maintained during the subsequent positive half-cycle of the ac mains waveform. Thus, both devices remain in minimum rds configurations until switch 812 closes.

Figure 10:
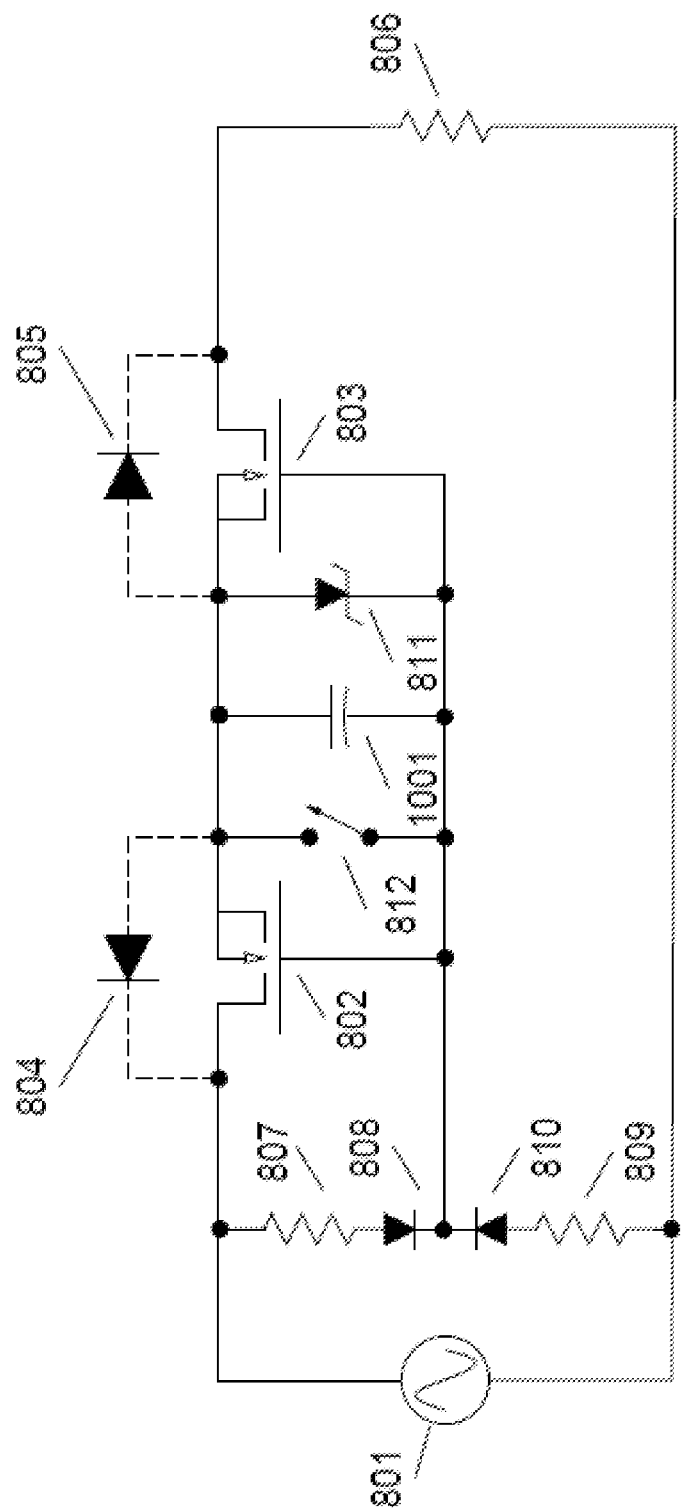
FIG. 10 is a schematic diagram of an improved version of the circuit in FIG. 8.

FIG. 10 shows the improved version of the circuit of FIG. 8 where the bias elements 807 and 808 are maintained to improve the initial turn-on characteristics during a positive half-cycle, and an additional capacitor 1001 in parallel with the gate-to-source capacitances of MOSFETs 802 and 803 is included to make the storage of the boosted gate-to-source bias voltage more robust. One limitation of this embodiment occurs when the switch circuit is being used in a phase-control mode wherein switch 812 is closed for a predetermined period during each cycle of the ac mains waveform. Since capacitor 1001 is discharged through switch 812 while it is closed, the gate-to-source bias required to turn MOSFETs 802 and 803 "on" must be re-established during each cycle. This results in MOSFET 802 always operating in a suboptimal mode if switch 812 opens during the positive half cycle of the ac mains waveform since the boost provided during the negative half cycle is reset when switch 812 closes.

Figure 11:
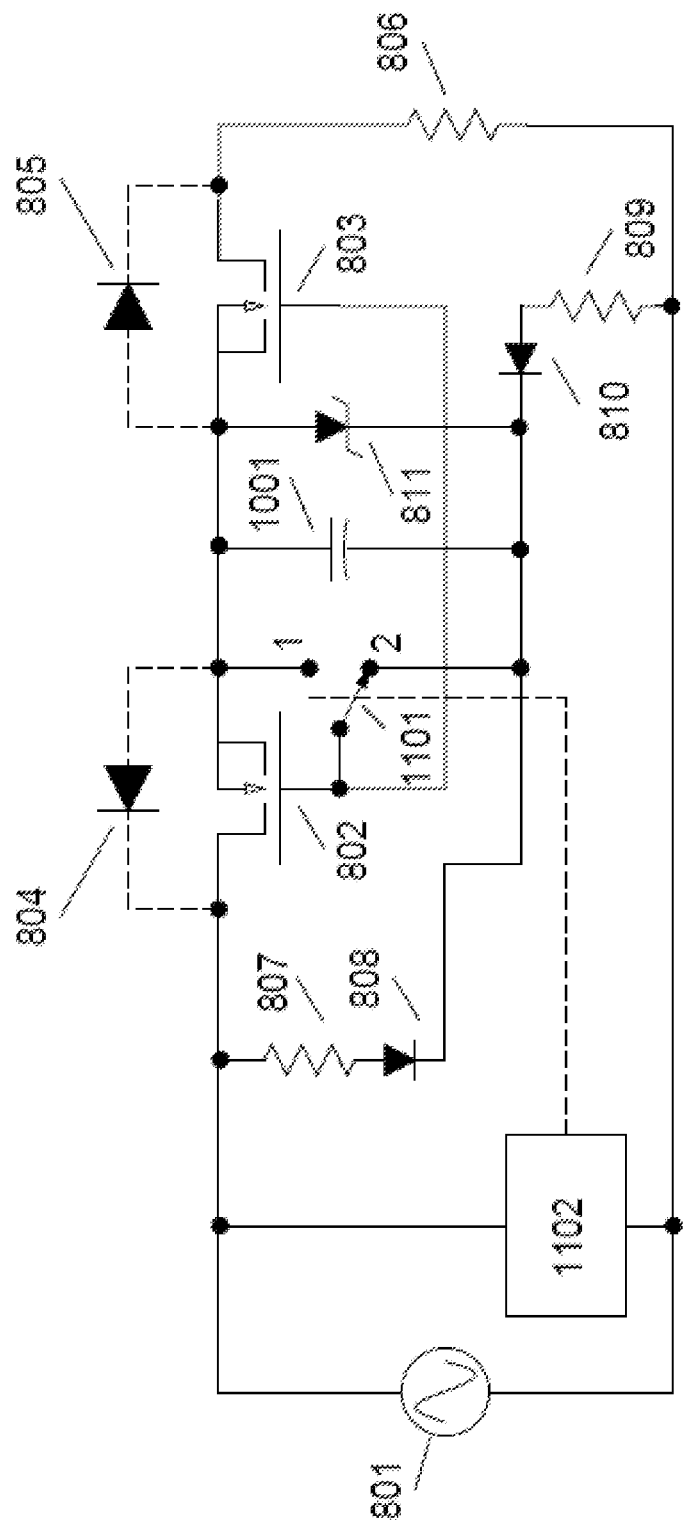
FIG. 11 is a schematic diagram that shows an embodiment of the circuit of FIG. 10 using a dual-pole switch.

FIG. 11 shows an embodiment of the circuit of FIG. 10 in which switch 812 is replaced with dual-pole switch 1101 that connects the gates of MOSFETs 802 and 803 either to their interconnected sources when in position 1 or to the Zener diode bias circuit when in position 2 which positions are determined by Switch Control circuit 1102. In this embodiment, placing switch 1101 in position 1 to turn MOSFETs 802 and 803 "off" disconnects the Zener diode bias circuit from the gates thereby allowing capacitor 1001 to store the Zener voltage until either it is discharged through the external circuitry or until switch 1101 is placed in position 2, resulting in re-application of the stored Zener voltage to the gate circuit and the subsequent refreshing of the gate-to-source bias voltage during a negative half-cycle.

Figure 12A:
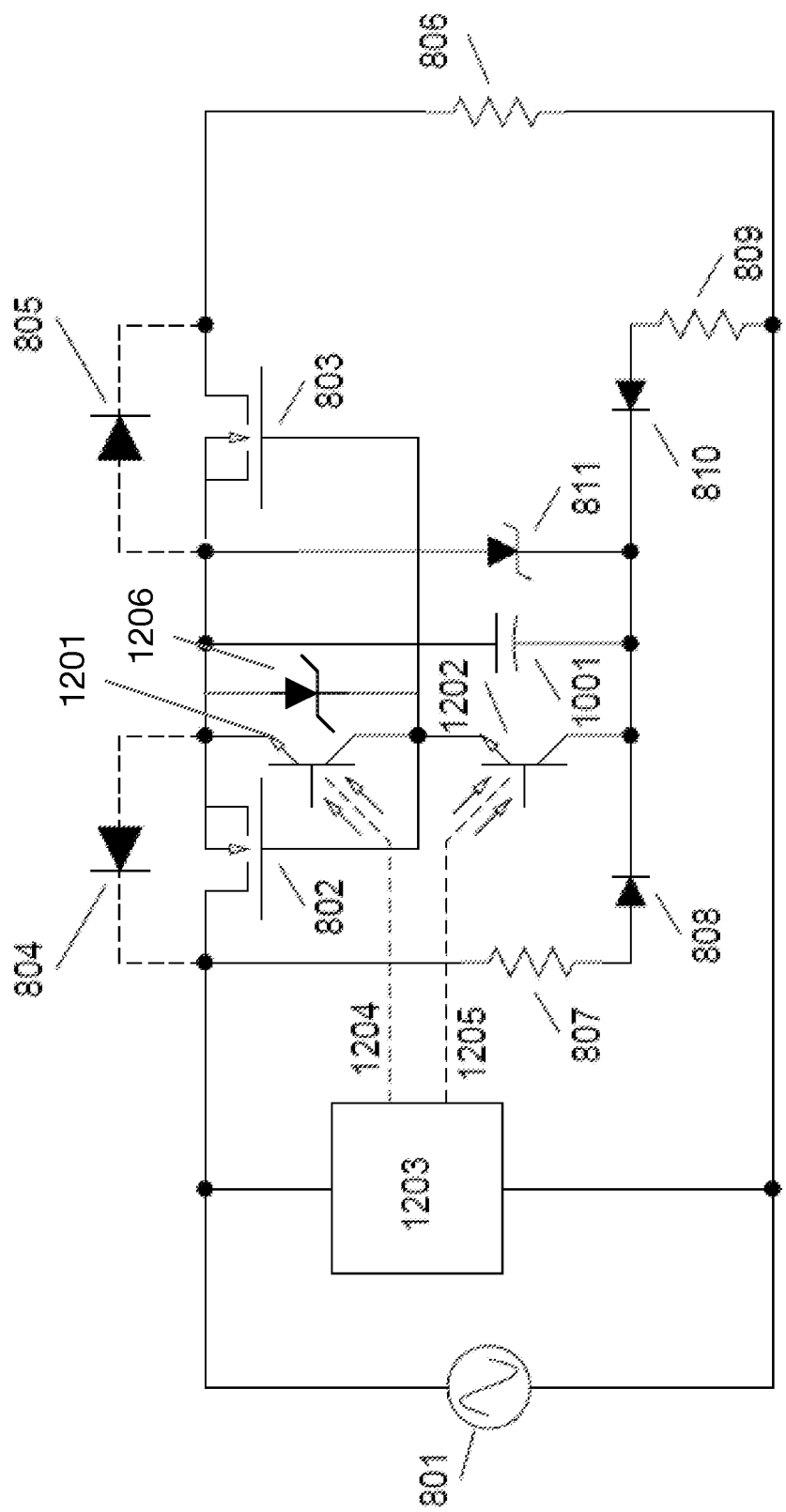
FIG. 12A is a schematic diagram that shows an embodiment of the circuit of FIG. 11 using phototransistors for the dual-pole switch.

FIG. 12A illustrates an embodiment of the circuit of FIG. 11 wherein switch 1101 is replaced with a pair of phototransistors 1201 and 1202 that are controlled by a Switch Control circuit 1203 having optical outputs 1204 and 1205 that drive 1201 and 1202, respectively. The Switch Control circuit 1203 synchronizes outputs 1204 and 1205 to the ac mains waveform to provide the phase-control mode capability. Gate to source voltage is regulated by Zener 1206. It is important that these optical drive signals not overlap, thereby providing a "break before make" switch characteristic in order to avoid discharging capacitor 1001 prematurely.

The time constant for the switch control allows for the rapid switching of the optical drive signals in synchronism with the AC mains waveform through external control circuitry (not shown) to provide phase control of the applied AC waveform, as is used in dimmer applications. In another embodiment the control signal is a train of pulses synchronized with the AC mains waveform and having adjustable pulse widths to effectively control the average current/power delivered to the load, thereby providing a dimming effect for a light source load and a speed control for an AC motor load. In another embodiment the control signal is a train of pulses having a fixed or variable frequency independent of the AC mains waveform thereby generating a radio-frequency (RF) power waveform at the load terminals for use as a wireless charger/generator. In another embodiment the control signal is a variable DC voltage allowing variable illumination of the LED thereby allowing the MOSFETs to operate in a linear mode. In a preferred embodiment the switch control circuit receives a control signal from a control signal source, and the switch control circuit optical drive signals are pulsed in synchronism with the AC power source to provide phase control of the AC power to the load. In another embodiment, the optical drive signal is a train of pulses synchronized with the AC mains waveform and having adjustable pulse widths to effectively control the average current/power delivered to the load, thereby providing a dimming effect for a light source load and a speed control for an AC motor load.

FIG. 12A is an embodiment using an (optically) isolated controller for the switch. In another embodiment shown in FIGS. 12B and 12C the controller is not electrically isolated from the switch. Considering FIG. 12B the controller 1207 includes a control voltage, Vcc, 1209 relative to the common source connection 1208. The output of the controller 1210 is connected to the common gate terminal of the MOSFETs 802, 803. Zener diode 1206 acts as a voltage regulator for the gate to source applied voltages and resistor 1211 limits current applied to the common gate terminal. The other components are commonly labeled with the previous Figures and already explained. The interior of the controller 1207 is shown in FIG. 12C.

Figure 12B:
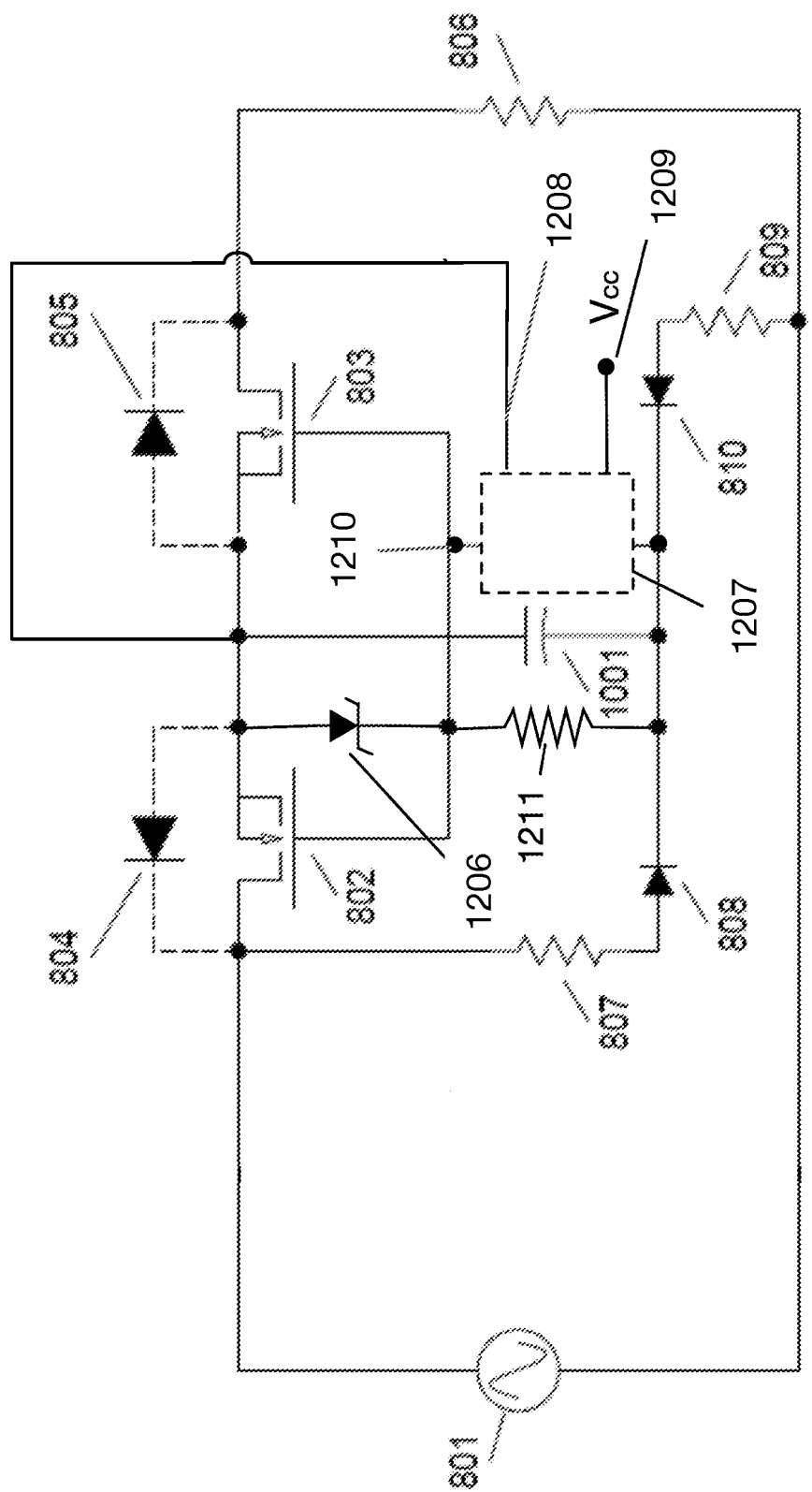
FIG. 12B is a schematic diagram that shows an embodiment using a non-isolated controller for on-off control.
Figure 12C:
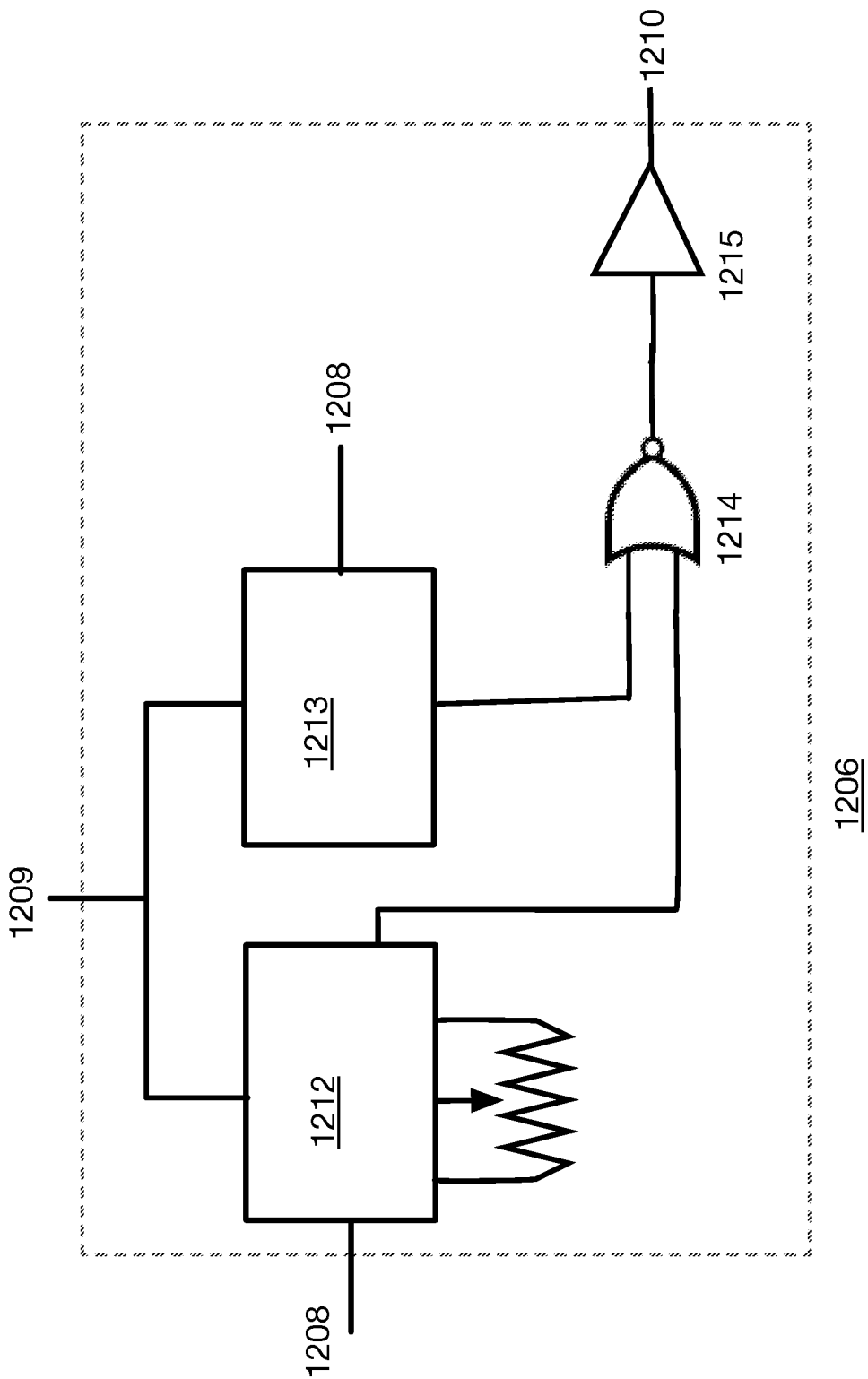
FIG. 12C is a schematic diagram of the details of an embodiment of the controller of FIG. 12B.

Referring to FIG. 12C, the input 1209, common 1208, and voltage output 1210 are as labeled in FIG. 12B. In the embodiment shown, the controller includes an on/off switch controller 1213 that on signal, provides an output voltage to force the MOSFETs to an off state. Also included in this embodiment is a controller using variable pulse width modulation unit 1212. The output of the on/off signal generator and the pulse width modulation generator are routed through a NOR gate 1214 and operational amplifier 1215 to the output 1210. The output 1210 is connected to the common gate terminal of the back to back MOSFETs as already shown.

Figure 13:
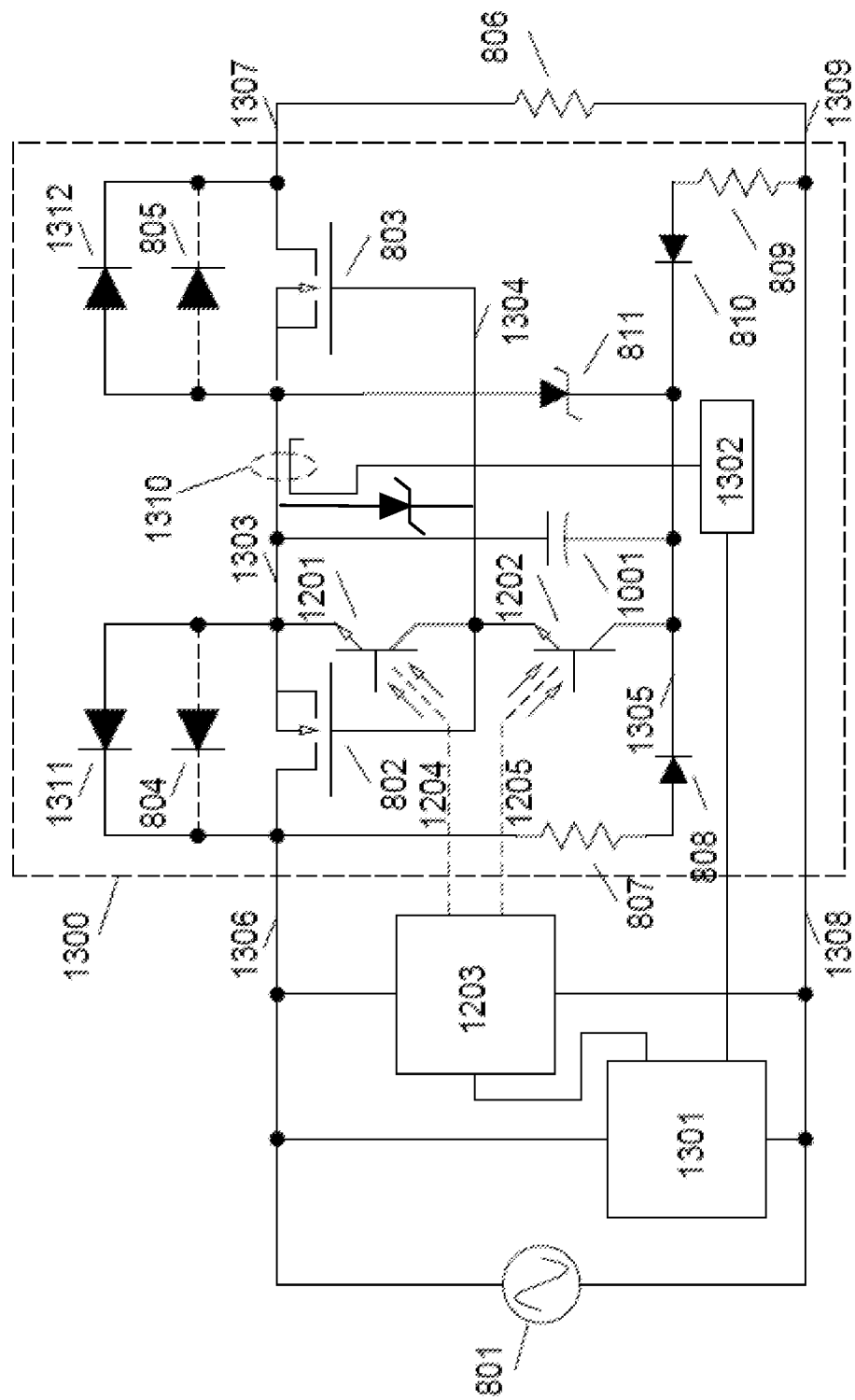
FIG. 13 is an embodiment of the bidirectional switch that includes current sense.

In another embodiment shown in FIG. 13 power to the switch control 1203 is provided by a low voltage AC to DC converter 1301. The AC to DC converter is in turn controlled by a current sensor 1302 which employs current sensor 1310 to sense the AC current delivered to load 806 such that the AC to DC converter and therefore the Switch control are turned off if no current is sensed in the bi-directional switch comprised of MOSFETs 802, 803. In this embodiment the bidirectional switch of FIG. 12 further includes bypass diodes 1311, 1312 which can bypass the intrinsic diodes 804, 805 of the MOSFETs 802, 803. All other components are consistently numbered and as discussed in previous FIGS. 8-12C.

To summarize, the solid state bidirectional switch comprises: first and second series connected electronic switch devices, each switch device having a drain terminal, a source terminal and a gate terminal and being characterized by a threshold voltage specified between the gate terminal and the source terminal, wherein the drain terminal of the first switch device comprises the first input terminal of the solid state bidirectional switch and drain terminal of the second switch devices comprise the first output terminal of the solid state bidirectional switch. The source terminals of the first and second switch devices are interconnected at a first control terminal and the gate terminals of the first and second switch devices are interconnected at a second control terminal. A first control switch is connected between the first control terminal and the second control terminal, and a bias terminal is connected to the second control terminal through a second control switch and a voltage regulator device connected between the bias terminal and the first control terminal. A capacitor is connected in parallel with the voltage regulator device. A first rectifier device is connected from the first input terminal of the switch circuit to the bias terminal through a first current limiting resistor, and, a second rectifier device is connected from the second output terminal of the switch circuit to the bias terminal through a second current limiting resistor. A switch control circuit controls the first control switch and the second control switch, such that first control switch is closed when the second control switch is open and vice versa.

Figure 14:
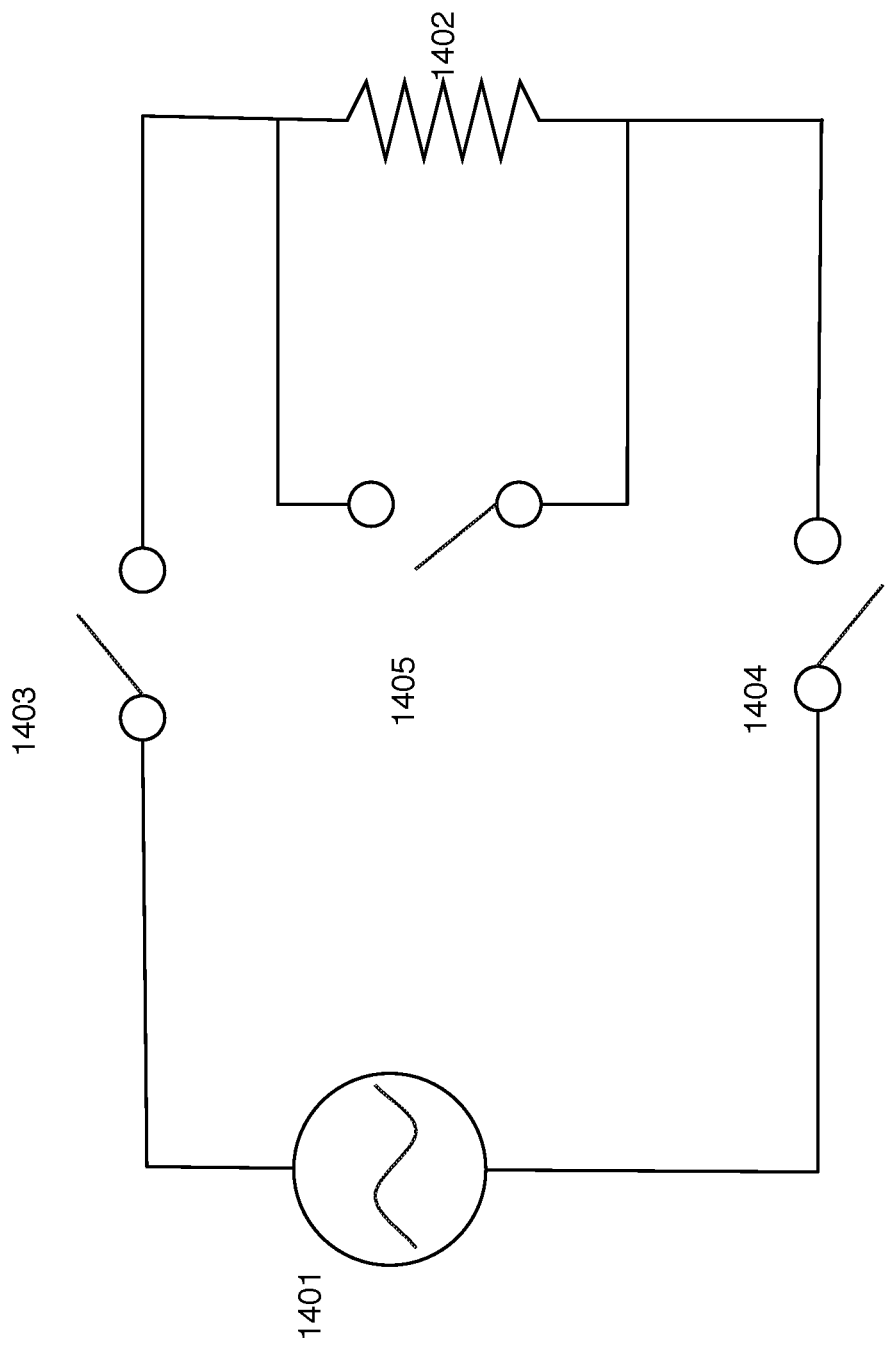
FIG. 14 illustrates an embodiment of the bidirectional switch circuit that includes an additional bidirectional switch placed across the load.

In another embodiment shown in FIG. 14, bidirectional switches 1403-1405, as described above are located between the source 1401 and the load 1402 and included in the line 1403 and the return 1404 as well as a bidirectional switch 1405 that bypasses the load 1402. Switch 1405 is closed when switch 1403 is open.

AC to DC Converter

In one embodiment, the AC to DC converter 1301 of FIG. 13 is comprised, as is known in the art, of a rectifier comprised of diode array and a step down transformer. In a preferred embodiment the AC to DC converter does not use a rectifier or transformer is comprised of elements as described in FIGS. 15 and 16.

Figure 15:
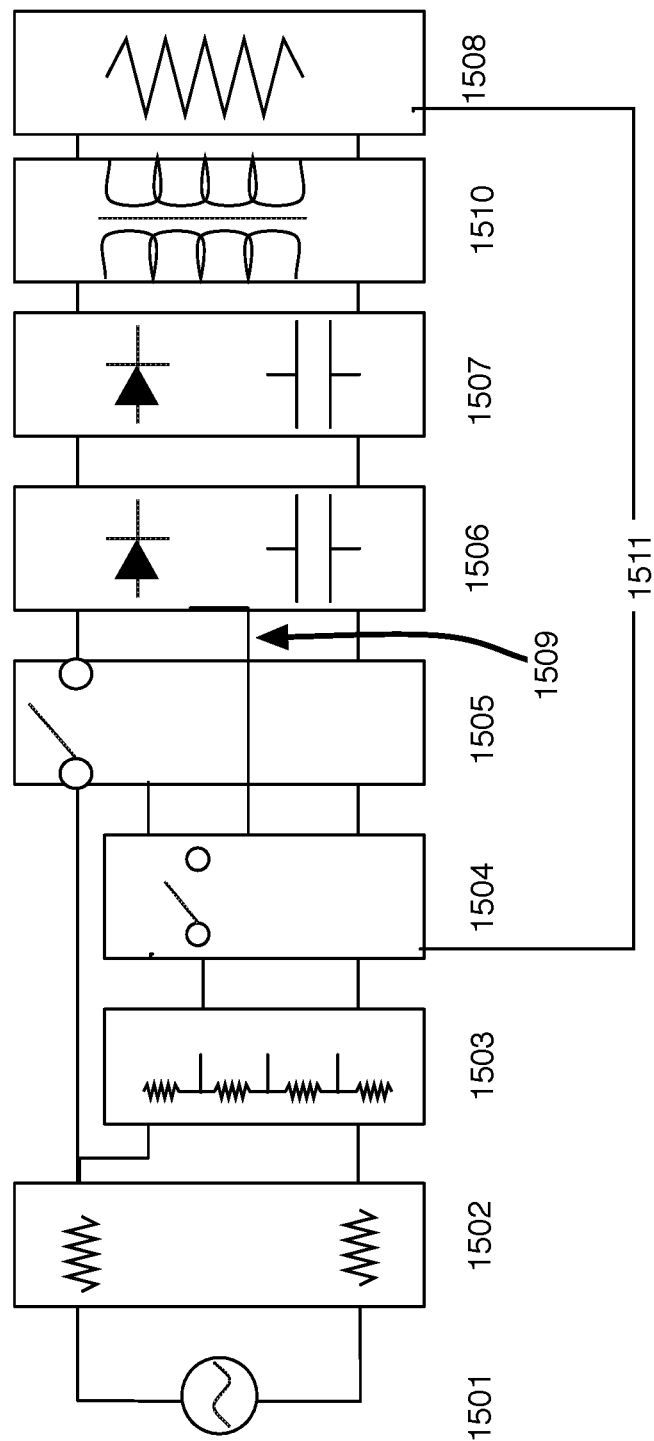
FIG. 15 illustrates an embodiment of the circuit wherein the AC to DC converter does not require a rectifier.
Figure 16:
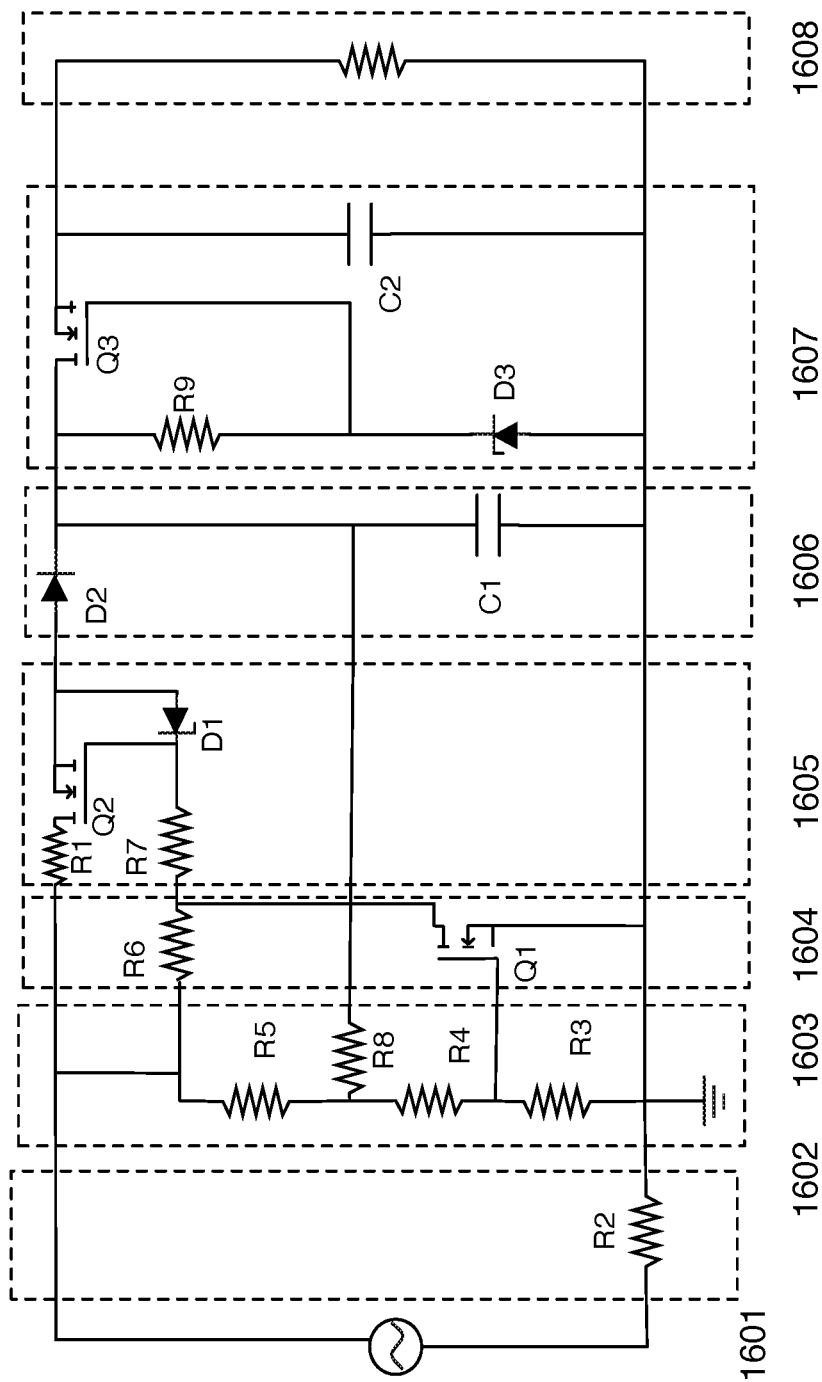
FIG. 16 is a schematic diagram that shows a non-limiting specific example of the circuit elements in the embodiment shown in FIG. 15.

The AC to DC converter, that does not require a rectifier, is comprised, generally, of the elements shown in FIG. 15 and the method implied by these elements. A non-limiting specific example of the circuit elements is shown in FIG. 16. Referring to FIG. 15 the AC source 1501 is connected to an inrush protection element 1502. In one embodiment the inrush element is comprised of resistor elements in the line and neutral of the AC supply. In another embodiment, where higher power and efficiency is required the inrush protection includes switch elements that provide high resistance at startup and switch the resistor elements out of the circuit at steady state operation. After the inrush protection the AC source is sampled using a sampling element 1503. In one embodiment the sampling element 1503 includes resistors configured into a voltage divider network. In another embodiment the sampling element includes a reference voltage source and comparator. In another embodiment the sampling element can be manually adjusted. In another embodiment the sampling element can be automatically adjusted. The sampled voltages are used as supply to a switch driver element 1504. In the preferred embodiment, the switch driver element 1504 receives a feedback voltage signal 1509 from the storage element 1506 and based upon the voltage signal, controls the voltage applied to the gate of a switching element in the control switch and clamp element 1505, thereby opening and closing the control switch 1506 to supply power to the storage element 1506 and ultimately the load 1508. In one embodiment, where the feedback 1509 is removed, the AC to DC converter is a feed forward converter where charging of the storage element 1506 is controlled from the the forward side 1503, 1504 and 1505. Addition of the the feedback control 1509 provides a means for both feed forward and feedback control. In one embodiment the balance of feed forward and feedback control is determined by the selection of components in the voltage sampling element 1503 and the feedback line 1509. In one embodiment the balance of feedforward and feedback control is determined by resistor elements in the sampling element 1503 and the feedback 1509. In another embodiment variable elements are used such that the feedforward and feedback control can be adjusted. In a preferred embodiment the switch driver is comprised of a voltage divider and a switch. The switch and clamp element 1505 controlled by the switch driver 1504 provides pulsed power at a fixed maximum current to the storage element 1506. In the preferred embodiment the switch and clamp element is comprised of an N-MOSFET and a Zener diode, connected source to gate, limits/clamps the peak voltage, and therefore peak current, to a pre-selected peak voltage value. In one embodiment the preselected limiting voltage is determined by value of the Zener voltage of the Zener diode bridging gate to source of an N-MOSFET component of the switch 1505. Power from the switch and clamp element comprised of pre-selected peak current pulse is provided to a storage element 1506. In one embodiment the voltage regulator is comprised of a capacitor used as an energy storage element and a diode. Charge on the capacitor is fed back through a voltage divider circuit to the switch driver 1504 thereby maintaining a constant charge on the capacitor. Output from the the storage element is fed through a voltage regulator 1507 to the load 1508. In another embodiment the AC to DC converter further includes a galvanic isolation element 1510. In another embodiment the AC to DC converter further includes elements 1511 that enable feedback from the load 1508. In the preferred embodiment the feedback circuit 1511 also includes galvanic isolation between the control element 1504 and the load 1508.

FIG. 16 shows the preferred embodiment of the AC to DC converter. Elements 1601 through 1608 correspond to elements 1501 to 1508 of FIG. 15 respectively. The AC source is connected to the inrush protection circuit 1601 comprised in this preferred embodiment of resistors R1 and R2. In another embodiment (not shown) the inrush protection includes switches such that the current flows through the resistors R1 and R2 at startup and bypasses the resistors once steady state operation is reached. In another embodiment the inrush control uses inductors; that is elements R1 and R2 are replaced with inductors L1 and L2. Output from the inrush protection goes to the switch Q2 of the switch and clamp circuit 1605 and to the voltage sampling element 1603. The voltage sampling element 1603 is comprised of resistors R3, R4, R5 sampling the AC input and resistor R8 providing a feedback voltage from storage capacitor C1. The values of R3, R4, R5 and R8 are selected such that the voltage to the gate of switch Q1 in the switch driver element 1604 turns switch Q1 on and off and thereby synchronously turns switch Q2 off and on thereby providing a preselected timed output pulse from switch Q2 to charge storage element C1. Resistor R8 provides a feedback path as to the charge on capacitor C1 and therefore the output voltage to the voltage sampling circuit 1603 and therefore to the control circuit 1604. The switch and clamp element 1605 is comprised of switch Q2, Zener Diode D1 and resistor R7. The switch Q2 is controlled by the switch driver circuitry 1604. The peak output current of switch Q2 is clamped to a preselected value based upon the selected values of the Zener voltage of diode D1. Pulsed output from the switch Q2 is connected to the voltage regulator 1606 which through the feedback of R8 to the voltage sampling 1603 and the switch driver 1604 holds capacitor C1 to a constant charge. Control element switch Q1 and therefore supply switch Q2 are activated, either opened or closed, in synch with the AC input. The AC to DC converter provides a low voltage output with pulse modulation at the frequency of the incoming AC source. The switches are activated, either opened or closed, at voltages that are near, within the threshold values for the components Q1 and Q2, of the zero crossing of the AC source. The Output then goes to voltage regulator 1607 and then load 1608. The voltage regulator 1607 includes switch Q3, Zener diode D3 resistor R9 and capacitor C2. Circuit components D3, Q3, R9 function as a voltage regulator equivalently to that already described for circuit elements 105, 104, 106 respectively in FIG. 1. Capacitor C2 provides storage capacity to buffer and thereby smooth the output from the AC to DC converter to the load 1608.

The AC to DC converter in the preferred embodiment of FIGS. 15 and 16 is comprised of elements of inrush protection 1502, voltage sampling 1503, a switch driver 1504, a switch and clamp 1505, a storage element 1506 and a voltage regulator 1507. Selection of components in the voltage sampling 1503 determine the timing of the switch driver 1504. Selection of elements in the switch and clamp determine a peak voltage and current for out pulses. Power output is controlled by selection of both the peak current and the pulse timing. Feedback from the storage element through the voltage sampling is used to select the pulse timing. The AC to DC converter operates in sync with the AC source.

The preferred embodiment of FIGS. 15 and 16 include in general a voltage divider 1503 connected to the power source 1501, and, a first switch 1504 connected through its input to the voltage divider, and, a second switch 1505 whose input is connected to the output of the first switch, and, a storage capacitor C1 connected through a diode to the output of the second switch, and, a sense resistor connected 1509 between the storage capacitor and the voltage divider thereby providing feedback control of the AC direct to DC extraction conversion system, and, a Zener diode D1 connected between the input and output of the second switch thereby clamping the voltage of the output and input of the second switch to the Zener voltage of the Zener diode, and, the electronic load 1508 connected to the storage capacitor C1. The switches 1504, 1505 may be any electronically actuated switch. In one embodiment the switches are N-MOSFETs. In another embodiment the switches are bipolar transistors and in another embodiment the switches are microelectromechanical switches.

SUMMARY

A bidirectional switch for the control of power from an AC source to a load is described. The approach uses power MOSFETs in a bidirectional switch subcircuit configuration having an optically coupled, electrically floating control circuit that self-biases the switches into the "on" state and uses an optically coupled control element to force the switches into the "off" state. The time constant of the control circuit is fast enough to allow phase control as well as on-off control. A boost circuit is included to ensure that the control voltage exceeds a threshold voltage of the MOSFETs to force an off state. A plurality of subcircuits can be easily cascaded to provide improved performance.

We claim:
1. A bidirectional switch having first and second input terminals and first and second output terminals wherein second input and second output terminals are interconnected and further comprising:
   a. first and second series connected electronic switch devices, each switch device having a drain terminal, a source terminal and a gate terminal and being characterized by a threshold voltage specified between the gate terminal and the source terminal, wherein the drain terminal of the first switch device comprises the first input terminal of the solid state bidirectional switch and drain terminal of the second switch devices comprise the first output terminal of the solid state bidirectional switch, the source terminals of the first and second switch devices are interconnected at a first control terminal and the gate terminals of the first and second switch devices are interconnected at a second control terminal, and,
   b. a first control switch connected between the first control terminal and the second control terminal, and
   c. a bias terminal connected to the second control terminal through a second control switch, and
   d. a voltage regulator device connected between the bias terminal and the first control terminal, and
   e. a capacitor connected in parallel with the voltage regulator device, and
   f. a first rectifier device connected from the first input terminal of the switch circuit to the bias terminal through a first current limiting resistor, and
   g. a second rectifier device connected from the second output terminal of the switch circuit to the bias terminal through a second current limiting resistor, and,
   h. a switch control circuit having a control signal that controls the first control switch and the second control switch, such that first control switch is closed when the second control switch is open and vice versa.

2. The bidirectional switch of claim 1 wherein the first control switch and the second control switch are phototransistors and the control signal is an optical signal.

3. The bidirectional switch of claim 1 wherein the first and second electronic switch devices are MOSFETs.

4. The bidirectional switch of claim 1 further comprising an AC to DC converter that supplies DC power to the switch control circuit.

5. The bidirectional switch of claim 4 wherein the AC to DC converter comprises:
   a. a voltage divider connected to the AC power source, and,
   b. a first semiconductor switch, having an input and an output, connected through its input to the voltage divider, and,
   c. a second semiconductor switch, having an input and an output, whose input is connected to the output of the first switch, and,
   d. a storage capacitor connected through a diode to the output of the second switch, and,
   e. a sense resistor connected between the storage capacitor and the voltage divider thereby providing feedback control, and,
   f. a Zener diode connected between the input and output of the second semiconductor switch thereby clamping the voltage of the output and input of the second semiconductor switch to the Zener voltage of the Zener diode, and, g. the DC load connected to the storage capacitor.

6. The bidirectional switch of claim 5 further comprising electronic circuitry interposed between the first semiconductor electronic switch and the storage capacitor to limit the current flowing through the first semiconductor switch.

7. The bidirectional switch of claim 5 wherein the first semiconductor switch and the second semiconductor switch are both MOS field effect transistors.

8. The bidirectional switch of claim 1, wherein the control signal is pulsed in synchronism with the AC power source to provide phase control of the AC power to the load.

9. The bidirectional switch circuit of claim 1, wherein the control signal is a train of pulses synchronized with the AC mains waveform and having adjustable pulse widths to control the average current/power delivered to the load, thereby providing a dimming effect for a light source load and a speed control for an AC motor load.

10. An electrical circuit to supply power from an AC source, having a line and a return, to a load, the electrical circuit comprising:
   a. a first bidirectional switch connected in the line comprising:
      i. first and second series connected electronic switch devices, each switch device having a drain terminal, a source terminal and a gate terminal and being characterized by a threshold voltage specified between the gate terminal and the source terminal, wherein the drain terminal of the first switch device comprises the input terminal of the solid state bidirectional switch and drain terminal of the second switch devices comprise the output terminal of the solid state bidirectional switch, the source terminals of the first and second switch devices are interconnected at a first control terminal and the gate terminals of the first and second switch devices are interconnected at a second control terminal, and,
      ii. a first control switch connected between the first control terminal and the second control terminal, and
      iii. a bias terminal connected to the second control terminal through a second control switch, and
      iv. a voltage regulator device connected between the bias terminal and the first control terminal, and
      v. a capacitor connected in parallel with the voltage regulator device, and
      vi. a first rectifier device connected from the input terminal of the switch circuit to the bias terminal through a first current limiting resistor, and
      vii. a second rectifier device connected from the return to the bias terminal through a second current limiting resistor, and,
      viii. a switch control circuit having a control signal that controls the first control switch and the second control switch, such that first control switch is closed when the second control switch is open and vice versa, and,
   b. an AC to DC converter that supplies DC power to the switch control circuit, wherein the AC to DC converter comprises:
      i. a voltage divider connected to the AC power source, and,
      ii. a first semiconductor switch, having an input and an output, connected through its input to the voltage divider, and,
      iii. a second semiconductor switch, having an input and an output, whose input is connected to the output of the first switch, and,
      iv. a storage capacitor connected through a diode to the output of the second switch, and,
      v. a sense resistor connected between the storage capacitor and the voltage divider thereby providing feedback control, and,
      vi. a Zener diode connected between the input and output of the second semiconductor switch thereby clamping the voltage of the output and input of the second semiconductor switch to the Zener voltage of the Zener diode, and,
      vii. the DC load connected to the storage capacitor, and,
      viii. electronic circuitry interposed between the first semiconductor electronic switch and the storage capacitor to limit the current flowing through the first semiconductor switch.

11. The electrical circuit of claim 10 further comprising a second bidirectional switch located in the return line of the AC source between the interconnection of the second rectifier device of the first bidirectional switch and the load, wherein the second bidirectional switch is comprised identically to the first bidirectional switch except that the second rectifier device of the second bidirectional switch is connected to the line between the AC source and the input terminal of the first bidirectional switch, and, the switch control circuit controls the first bidirectional switch and the second bidirectional switch.

12. The electrical circuit of claim 11 wherein the first bidirectional switch and the second bidirectional switch are opened and closed in synchronism.

13. The electrical circuit of claim 11 further comprising a third bidirectional switch that bypasses the load, the third bidirectional switch comprised identically to the first and second bidirectional switches except that the second rectifier device of the third bidirectional switch is connected to the output of the third bidirectional switch circuit and the switch control circuit controls the first bidirectional switch, the second bidirectional switch, and, the third bidirectional switch.

14. The electrical circuit of claim 13 wherein the third bidirectional switch is open when the first bidirectional switch is closed and the third bidirectional switch is closed when the first bidirectional switch is open.

15. The electrical circuit of claim 10, wherein the switch control circuit is pulsed in synchronism with the AC power source to provide phase control of the AC power to the load.

16. The electrical circuit of claim 10, wherein the switch control signal is a train of pulses synchronized with the AC mains waveform and having adjustable pulse widths to effectively control the average current/power delivered to the load, thereby providing a dimming effect for a light source load and a speed control for an AC motor load.

17. An electrical circuit to supply power from an AC source, having a line and a return, to a load, the electrical circuit comprising:
   a. a first bidirectional switch connected in the line comprising:
      i. first and second series connected electronic switch devices, each switch device having a drain terminal, a source terminal and a gate terminal and being characterized by a threshold voltage specified between the gate terminal and the source terminal, wherein the drain terminal of the first switch device comprises the input terminal of the solid state bidirectional switch and drain terminal of the second switch devices comprise the output terminal of the solid state bidirectional switch, the source terminals of the first and second switch devices are interconnected at a first control terminal and the gate terminals of the first and second switch devices are interconnected at a second control terminal, and,
ii. a control device connected between the first control terminal and the second control terminal, the control device receiving a switch control signal, and,
iii. a bias terminal connected to the control device, and
iv. a voltage regulator device connected between the first control terminal and the second control terminal, and,
v. a capacitor connected in parallel with the control device, and
vi. a first rectifier device connected from the input terminal of the switch circuit to the bias terminal of the control device through a first current limiting resistor, and
vii. a second rectifier device connected from the return to the control device through a second current limiting resistor to the bias terminal of the control device, and,
b. an AC to DC converter that supplies DC power to the control device.

18. The electrical circuit of claim 17, wherein the AC to DC converter comprises:
i. a voltage divider connected to the AC power source, and,
ii. a first semiconductor switch, having an input and an output, connected through its input to the voltage divider, and,
iii. a second semiconductor switch, having an input and an output, whose input is connected to the output of the first switch, and,
iv. a storage capacitor connected through a diode to the output of the second switch, and,
v. a sense resistor connected between the storage capacitor and the voltage divider thereby providing feedback control, and,
vi. a Zener diode connected between the input and output of the second semiconductor switch thereby clamping the voltage of the output and input of the second semiconductor switch to the Zener voltage of the Zener diode, and,
vii. the DC load connected to the storage capacitor, and,
viii. electronic circuitry interposed between the first semiconductor electronic switch and the storage capacitor to limit the current flowing through the first semiconductor switch.

19. The electrical circuit of claim 17 further comprising a second bidirectional switch located in the return line of the AC source between the interconnection of the second rectifier device of the first bidirectional switch and the load, wherein the second bidirectional switch is comprised identically to the first bidirectional switch except that the second rectifier device of the second bidirectional switch is connected to the line between the AC source and the input terminal of the first bidirectional switch, and, the switch control circuit controls the first bidirectional switch and the second bidirectional switch.

20. The electrical circuit of claim 18 wherein the first bidirectional switch and the second bidirectional switch are opened and closed in synchronism.

21. The electrical circuit of claim 18 further comprising a third bidirectional switch that bypasses the load, the third bidirectional switch comprised identically to the first and second bidirectional switches except that the second rectifier device of the third bidirectional switch is connected to the output of the third bidirectional switch circuit and the switch control circuit controls the first bidirectional switch, the second bidirectional switch, and, the third bidirectional switch.

22. The electrical circuit of claim 20 wherein the third bidirectional switch is open when the first bidirectional switch is closed and the third bidirectional switch is closed when the first bidirectional switch is open.

23. The electrical circuit of claim 17, wherein the switch control circuit is pulsed in synchronism with the AC power source to provide phase control of the AC power to the load.

24. The electrical circuit of claim 17, wherein the switch control signal is a train of pulses synchronized with the AC mains waveform and having adjustable pulse widths to effectively control the average current/power delivered to the load, thereby providing a dimming effect for a light source load and a speed control for an AC motor load.

25. The electrical circuit of claim 17 wherein the control device comprises an on/off switch device, and a pulse width modulation device, each having an output and the outputs connected through a NOR gate and an amplifier to the second control terminal.

* * * * *